(12) United States Patent
Nishikawa et al.

(10) Patent No.: US 7,639,413 B2
(45) Date of Patent: Dec. 29, 2009

(54) RESONANT OPTICAL SCANNER USING VIBRATING BODY WITH OPTIMIZED RESONANT FREQUENCY CHARACTERISTICS AND IMAGE FORMING APPARATUS HAVING THE SAME

(75) Inventors: Yasuo Nishikawa, Nagoya (JP); Nobuaki Asai, Hashima-gun (JP)

(73) Assignee: Brother Kogyo Kabushiki Kaisha, Nagoya (JP)

(*) Notice: Subject to any disclaimer, the term of this patent is extended or adjusted under 35 U.S.C. 154(b) by 287 days.

(21) Appl. No.: 11/526,734

(22) Filed: Sep. 26, 2006

(65) Prior Publication Data

US 2007/0070481 A1 Mar. 29, 2007

Related U.S. Application Data

(63) Continuation of application No. PCT/JP2005/004040, filed on Mar. 9, 2005.

(30) Foreign Application Priority Data

Mar. 26, 2004 (JP) .............................. 2004-090890

(51) Int. Cl.
  *G02B 26/08* (2006.01)
(52) U.S. Cl. ............... 359/224.1; 359/198.1; 359/199.1
(58) Field of Classification Search .... 359/224.1–224.2
See application file for complete search history.

(56) References Cited

U.S. PATENT DOCUMENTS 5,629,790 A * 5/1997 Neukermans et al. ....... 359/198
5,969,465 A * 10/1999 Neukermans et al. ....... 310/333
7,446,911 B2 * 11/2008 Asai et al. .................... 358/481

(Continued)

FOREIGN PATENT DOCUMENTS

JP    A 2002-174794    6/2002

(Continued)

OTHER PUBLICATIONS

Atsuhiro Mase et al., "Proposal and Experiment of an Optical Scanner with a Large Scan Angle and a High Frequency for a Display," Institute of Electrical Engineers of Japan, Inc., Nov. 27-28, 2002.

(Continued)

*Primary Examiner*—James Phan
(74) *Attorney, Agent, or Firm*—Oliff & Berridge, PLC

(57) ABSTRACT

An apparatus for use in optical scanning is disclosed which vibrates at least a part of a vibrating body having a light-reflective surface, to thereby allow light, upon entry, to be reflected from the light-reflective surface in varying directions. The vibrating body includes: (a) a reflective mirror having the light-reflective surface; and (b) an integral spring extending from the reflective mirror and being excited to generate at least a torsional vibration. The vibrating body has vibrational characteristics in which whether or not a resonant frequency of the torsional vibration and a resonant frequency of a disturbing vibration are equal to each other depends upon a shape-defining parameter for defining a shape of the integral spring extending lengthwise. The shape-defining parameter is pre-set to fall within a range allowing the resonant frequency of the torsional vibration and the resonant frequency of the disturbing vibration to be different from each other.

16 Claims, 18 Drawing Sheets

U.S. PATENT DOCUMENTS

2001/0036000 A1   11/2001   Nishikawa et al.
2003/0072066 A1   4/2003    Hayashi et al.

FOREIGN PATENT DOCUMENTS

| JP | A 2002-250890 | 9/2002 |
|---|---|---|
| JP | A 2003-57586 | 2/2003 |
| JP | A 2003-84226 | 3/2003 |
| JP | A 2003-207737 | 7/2003 |

OTHER PUBLICATIONS

Nobuaki Asai et al., "A Novel High Resolution Optical Scanner Actuated by Aerosol Deposited PZT Films," IEEE; The materials for the Sixteenth Annual International Conference on Micro Electro Mechanical Systems, Jan. 19-23, 2003, Kyoto, Japan; pp. 247-250.

Nobuaki Asai et al., "Fabrication of High Speed Micro Optical Scanner Using PZT Thick Film formed by Aerosol Deposition Mehtod," The materials for the 20$^{th}$ conference on Ferroelectric Materials and Their Applications, May 28-31, 2003, Kyoto, Japan; pp. 177-178.

\* cited by examiner (a)

(b)

(c)

RESONANT OPTICAL SCANNER USING VIBRATING BODY WITH OPTIMIZED RESONANT FREQUENCY CHARACTERISTICS AND IMAGE FORMING APPARATUS HAVING THE SAME

CROSS-REFERENCE TO RELATED APPLICATIONS

This application is based on Japanese Patent Application No. 2004-90890 filed Mar. 26, 2004 and International Application No. PCT/JP2005/4040 filed Mar. 9, 2005, the contents of which are incorporated hereinto by reference.

This application is a continuation application of International Application No. PCT/JP2005/4040 filed Mar. 9, 2005, now pending, which was published in Japanese under PCT Article 21(2).

BACKGROUND OF THE INVENTION

1. Field of the Invention

The invention relates to techniques for use in optical scanning, of vibrating at least a part of a vibrating body having a light-reflective surface, to thereby allow light, upon entry, to be reflected from the light-reflective surface in varying directions, and more particularly to techniques of optimizing resonant frequency characteristics of the vibrating body by optimizing the shape of the vibrating body.

2. Description of the Related Art

There are known apparatuses for use in optical scanning, each of which vibrates at least a part of a vibrating body having a light-reflective surface, to thereby allow light, upon entry, to be reflected from the light-reflective surface in varying directions.

There is known an example of such optical scanning apparatuses which employs a vibrating body including both a reflective mirror having a reflective surface and a couple of elastic beams extending from the reflective mirror and being excited to generate at least a torsional vibration, and in which optical scanning is achieved by vibrating at least a part of the vibrating body. See, for example, Japanese Patent Application Publication No. 2003-84226.

Applications in which such kinds of optical scanning apparatuses are utilized include ones in which an increase in scanning frequency is one of critical desires for design.

For example, for the applications in which images are formed using such optical scanning apparatuses, the higher a scanning frequency, the larger the number of scan lines per a single frame of an image. Therefore, for these applications, resolution and definition of a displayed image rely on a scanning frequency, and more specifically, the higher a scanning frequency, the higher resolution and definition of a displayed image.

As a result, for these applications, optical scanning apparatuses are designed to maximize a scanning frequency.

BRIEF SUMMARY OF THE INVENTION

Having conducted a research on the relationship between a scanning frequency and the resonant frequency characteristics of the vibrating body in the aforementioned optical scanning apparatuses, the present inventors have acquired the following findings.

In the aforementioned optical scanning apparatuses, in which optical scanning is performed using a torsional vibration of the vibrating body, not only the torsional vibration but also an unwanted disturbing vibration which is other than the torsional vibration is likely to occur. An example of such a disturbing vibration is a vibration generated in the reflective mirror of the vibrating body in a direction parallel to the reflective surface of the reflective mirror, which is to say, a lateral vibration.

Due to the above, it is critical to improvement in optical scanning stability that optical scanning is performed using a vibration of the vibrating body, with only a torsional vibration being generated in the vibrating body. Therefore, for such optical scanning apparatuses, typically, a vibrating body is vibrated at the same frequency as a resonant frequency of a torsional vibration.

However, when a resonant frequency of a torsional vibration and a resonant frequency of a disturbing vibration are equal or close to each other, even if the vibrating body is vibrated at the same frequency as the resonant frequency of the torsional vibration, the disturbing vibration is unwantedly superimposed on the torsional vibration in the vibrating body. If a disturbing vibration superimposedly occurs on the torsonal vibration, then a vibrational state of the reflective surface of the reflective mirror unwantedly deviates from a desired one, as the vibrating body vibrates, resulting in deviation of optical scanning characteristics from desired ones.

Under these circumstances, the present inventors have conducted a research on resonant frequency characteristics exhibited by such a vibrating body, which is to say, a relationship between diversity in resonant frequency between various modes of vibrations and the shape of the vibrating body, resulting in realization of the following facts.

For a vibrating body that the present inventors have focused on, when the shape of the vibrating body is configured so as to exhibit a higher resonant frequency of a torsional vibration, a resonant frequency of a disturbing vibration strongly greatly tends to be close to a resonant frequency of the torsional vibration, and becomes coincide with the resonant frequency of the torsional vibration in certain circumstances.

However, even when the vibrating body is configured in shape so as to exhibit a higher resonant frequency of a torsional vibration, optimization of the shape of the vibrating body would create a tendency of the resonant frequency of the disturbing vibration deviating from the resonant frequency of the torsional vibration.

It is therefore an object of the present invention to provide techniques for use in optical scanning, of vibrating at least a part of a vibrating body having a light-reflective surface, to thereby allow light, upon entry, to be reflected from the light-reflective surface in varying directions, and of optimizing resonant frequency characteristics of the vibrating body by optimizing the shape of the vibrating body.

According to a first aspect of the present invention, an apparatus for use in optical scanning is provided, which vibrates at least a part of a vibrating body having a light-reflective surface, to thereby allow light, upon entry, to be reflected from the light-reflective surface in varying directions.

In this apparatus, the vibrating body comprises:

(a) a reflective mirror having the light-reflective surface; and (b) an integral spring extending from the reflective mirror and being excited to generate at least a torsional vibration, wherein the vibrating body has vibrational characteristics in which whether or not a resonant frequency of the torsional vibration and a resonant frequency of a disturbing vibration are equal to each other depends upon a shape-defining parameter for defining a shape of the integral spring extending lengthwise, the disturbing vibration being in the form of a vibration of the integral spring other than the torsional vibration thereof, and wherein the shape-defining parameter is pre-set to fall within a range allowing the resonant frequency of the torsional vibration and the resonant frequency of the disturbing vibration to be different from each other.

According to a second aspect of the present invention, an apparatus for forming an image by scanning a light beam is provided, which comprises:

a light source emitting the light beam; and an optical scanning device having an optical scanner, scanning the light beam emitted from the light source, using the optical scanner, wherein the optical scanner, for use in optical scanning, vibrates at least a part of a vibrating body having a light-reflective surface, to thereby allow the light beam, upon entry, to be reflected from the light-reflective surface in varying directions.

In this optical scanner, the vibrating body comprises:

(a) a reflective mirror having the light-reflective surface; and (b) an integral spring extending from the reflective mirror and being excited to generate at least a torsional vibration, wherein the vibrating body has vibrational characteristics in which whether or not a resonant frequency of the torsional vibration and a resonant frequency of a disturbing vibration are equal to each other depends upon a shape-defining parameter for defining a shape of the integral spring extending lengthwise, the disturbing vibration being in the form of a vibration of the integral spring other than the torsional vibration thereof, and wherein the shape-defining parameter is pre-set to fall within a range allowing the resonant frequency of the torsional vibration and the resonant frequency of the disturbing vibration to be different from each other.

For those apparatuses, the term "integral spring" may be interpreted to mean that all parts that are necessary to complete the entire spring are all monolithically fabricated, mean that those parts are individually fabricated and combined together, or mean a composite spring comprised of various spring portions or elements.

Additionally, the term "shape-defining parameter" may be interpreted to mean a lengthwise distribution of cross-sectional shapes of the integral spring, or mean a lengthwise cross-sectional geometry of the integral spring.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
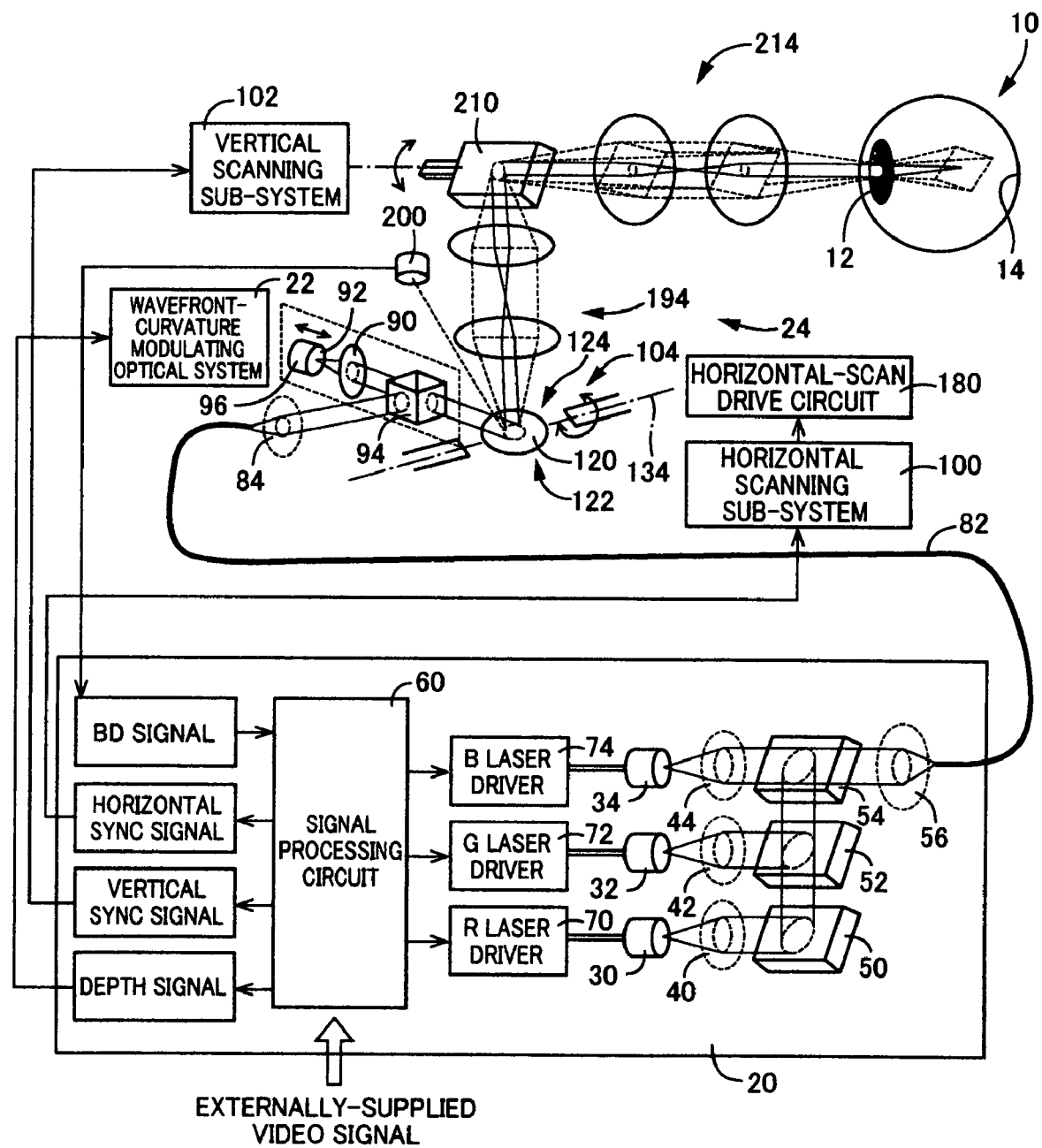
FIG. 1 is a schematic view illustrating a retinal scanning display device including an optical scanner 104 constructed according to a first embodiment of the present invention.

The object mentioned above may be achieved according to any one of the following modes of this invention.

These modes will be stated below so as to be sectioned and numbered, and so as to depend upon the other mode or modes, where appropriate. This is for a better understanding of some of a plurality of technological features and a plurality of combinations thereof disclosed in this description, and does not mean that the scope of these features and combinations is interpreted to be limited to the scope of the following modes of this invention.

That is to say, it should be interpreted that it is allowable to select the technological features which are stated in this description but which are not stated in the following modes, as the technological features of this invention.

Furthermore, stating each one of the modes of the invention in such a dependent form as to depend from the other mode or modes does not exclude the possibility that the technological features set forth in a dependent-form mode become independent of those set forth in the corresponding depended mode or modes and to be removed therefrom. It should be interpreted that the technological features set forth in a dependent-form mode is allowed to become independent, where appropriate.

(1) An apparatus for use in optical scanning, which vibrates at least a part of a vibrating body having a light-reflective surface, to thereby allow light, upon entry, to be reflected from the light-reflective surface in varying directions, the vibrating body comprising:

(a) a reflective mirror having the light-reflective surface; and (b) an integral spring extending from the reflective mirror and being excited to generate at least a torsional vibration, wherein the vibrating body has vibrational characteristics in which whether or not a resonant frequency of the torsional vibration and a resonant frequency of a disturbing vibration are equal to each other depends upon a shape-defining parameter for defining a shape of the integral spring extending lengthwise, the disturbing vibration being in the form of a vibration of the integral spring other than the torsional vibration thereof, and wherein the shape-defining parameter is pre-set to fall within a range allowing the resonant frequency of the torsional vibration and the resonant frequency of the disturbing vibration to be different from each other.

The present inventors have conducted a research on an apparatus for use in optical scanning, which vibrates at least a part of a vibrating body having a light-reflective surface, to thereby allow light, upon entry, to be reflected from the light-reflective surface in varying directions. The present inventors have invented a concept of "shape-defining parameter" for defining a shape of an integral or composite spring extending lengthwise, and have focused on the shape-defining parameter during the research.

As a result of the above research, the present inventors have found a fact that there is responsive to a value of the aforementioned shape-defining parameter a relationship between a resonant frequency of a torsional vibration and a resonant frequency of a disturbing vibration which is other than the torsional vibration, which is to say, a relative relation in resonant frequency between those torsional and disturbing vibrations, meaning whether or not their resonant frequencies are equal to each other.

Further, the present inventors have also found that some cases exist where a vibrating body exhibits vibrational characteristics in which whether or not a resonant frequency of a torsional vibration and a resonant frequency of a disturbing vibration are equal to each other depends on a set value of the shape-defining parameter.

Still further, the present inventors have still also found that a tendency in which a relative relation in resonant frequency between torsional and disturbing vibrations varies with a varying value of the shape-defining parameter is strongly emphasized when the resonant frequency of the torsional vibration, i.e., a scanning frequency of the instant apparatus is higher than when it is lower.

More specifically, the "tendency" includes, for example, a tendency in which a difference between those resonant frequencies, does not remain unchanged, but decreases, and as a result, those resonant frequencies become closer or equal to each other, or a tendency in which a difference between those resonant frequencies increases, and as a result, those resonant frequencies become farther from each other.

Based on the above findings, the apparatus according to the present mode (1) is constructed such that, when a vibrating body has vibrational characteristics in which whether or not a resonant frequency of a torsional vibration and a resonant frequency of a disturbing vibration are equal to each other depends upon a shape-defining parameter, the shape-defining parameter is pre-set or pre-established to fall within a range allowing the resonant frequency of the torsional vibration and the resonant frequency of the disturbing vibration to be different from each other.

This apparatus, therefore, would facilitate an increase in scanning frequency as a result of optimization of the shape-defining parameter, without requiring a resonant frequency of the disturbing vibration to become closer to a resonant frequency of the torsional vibration.

As a result, this apparatus would make it easier to design the shape of the integral spring extending lengthwise so as to be proper for providing a stabilized vibration of the vibrating body at a higher frequency.

(2) The apparatus according to mode (1), wherein the vibrating body includes a stationary member cooperating with the reflective mirror to support the integral spring, with its both ends being coupled to the stationary member, wherein the integral spring includes:

a first spring portion, coupled at its one end to the reflective mirror, and excited to generate a torsional vibration; and a plurality of second spring portions coextending from a remaining end of the first spring portion in a bifurcation fashion, coupled to the stationary member, and excited to generate a bending vibration and a torsional vibration.

This apparatus constructed according to the present mode (2) would provide an embodiment of the integral spring which is suitably configured for increasing optical scanning speed, in the form of an integral spring, after extending out from the reflective mirror, being divided (e.g., extending in a bifurcation fashion), and then reaching the stationary member.

(3) The apparatus according to mode (2), wherein each of the second spring portions, when divided into a first division disposed close to the stationary member and a second division disposed close to the first spring portion, is smaller in thickness of plate at the first division than at the second division.

For this type of apparatus for use in optical scanning, a case exists in which a vibrator vibrating the vibrating body is mounted on the vibrating body. In this case, an overlying complex of the vibrator and the vibrating body tends to increase in size due to the mounting of the vibrator.

In contrast, for the instant apparatus constructed according to the present mode (3), the integral spring is configured to have a thinned localized area located in the lengthwise direction, allowing a vibrator to be mounted on the thinned localized area. The mounting of the vibrator in this manner would not require an overlying complex of the vibrator and the integral spring to become larger in size than when the vibrator is mounted on the integral spring without thinning the integral spring locally.

(4) The apparatus according to mode (2) or (3), wherein the shape-defining parameter is pre-set to allow a position at which the first spring portion and the plurality of second spring portions are coupled to each other, to be disposed apart from a center of a lengthwise dimension of the integral spring.

This apparatus constructed according to the present mode (4) would provide an embodiment of the vibrating body in which resonant frequencies are different between a torsional vibration and a disturbing vibration, in the form of a vibrating body configured such that a first spring portion and a plurality of second spring portions are coupled to each other at a location disposed apart from a center of a lengthwise dimension of the integral spring.

(5) The apparatus according to any one of modes (2)-(4), wherein the shape-defining parameter is pre-set to allow lengthwise dimensions of the plurality of second spring portions to be greater than a lengthwise dimension of the first spring portion.

This apparatus constructed according to the present mode (5) would provide an embodiment of the vibrating body in which resonant frequencies are different between a torsional vibration and a disturbing vibration, in the form of a vibrating body configured such that lengthwise dimensions of a plurality of second spring portions are greater than a lengthwise dimension of a first spring portion.

(6) The apparatus according to any one of modes (2)-(5), wherein the disturbing vibration is a lateral vibration in which the reflective mirror is vibrated in a direction parallel to the light-reflective surface.

This apparatus constructed according to the present mode (6) would provide an embodiment of the vibrating body in which resonant frequencies are different between a torsional vibration and a lateral vibration.

(7) The apparatus according to mode (6), wherein the shape-defining parameter is pre-set to fall within a range in which the resonant frequency of the torsional vibration is higher than a resonant frequency of the lateral vibration.

In a case where a frequency of at least one of a torsional vibration and a lateral vibration varies with a varying value of the shape-defining parameter, and where those torsional and lateral vibrations are equal in resonant frequency to each other at a certain value of the shape-defining parameter, a variable range of the shape-defining parameter includes a region in which a resonant frequency of the torsional vibration is higher than that of the lateral vibration; and a region in which a resonant frequency of the torsional vibration is lower than that of the lateral vibration.

In the above case, for the apparatus constructed according to the present mode (7), the shape-defining parameter is pre-set to fall within a range in which the resonant frequency of the torsional vibration is higher than the resonant frequency of the lateral vibration. The pre-setting may be advantageous, for example, in improving the easiness to fabricate the vibrating body, in optimizing the shape of the vibrating body for making it easier to mount an actuator as a vibrator or exciter on the vibrating body, etc.

(8) The apparatus according to mode (6) or (7), wherein the shape-defining parameter is pre-set to fall within a range in which the resonant frequency of the torsional vibration is approximately 1 kHz or more apart from a resonant frequency of the lateral vibration.

This apparatus constructed according to the present mode (8), because of its adequate separation of the resonant frequency of the torsional vibration from the resonant frequency of the lateral vibration, would avoid the vibration occurring in the vibrating body at the resonant frequency of the torsional vibration from been strongly affected by the lateral vibration.

(9) The apparatus according to any one of modes (2)-(8), wherein the resonant frequency of the torsional vibration is pre-set to fall within a range of approximately 12 kHz to approximately 40 kHz.

(10) The apparatus according to mode (9), wherein the shape-defining parameter is defined as a percentage of lengthwise dimensions of the plurality of second spring portions with respect to a lengthwise dimension of the integral spring, and wherein the shape-defining parameter is pre-set to fall within a range of approximately 65 percent to approximately 85 percent.

This apparatus constructed according to the present mode (10) would provide an embodiment of the vibrating body in which resonant frequencies are different between the torsional vibration and the disturbing vibration, in the form of a vibrating body having the shape-defining parameter pre-set to fall within a range of approximately 65 percent to approximately 85 percent, provided that the shape-defining parameter is defined as a percentage of lengthwise dimensions of the plurality of second spring portions with respect to a lengthwise dimension of the integral spring.

(11) The apparatus according to any one of modes (1)-(10), wherein the reflective mirror and the integral spring are each generally in the form of a plate and in coplanar alignment with each other.

(12) The apparatus according to any one of modes (1)-(11), wherein the reflective mirror is generally in the form of a disc having opposite faces, at least one of which is the light-reflective surface.

A reduction in a moment of inertia and an increase in a resonant frequency of a reflective mirror can be achieved more easily when the reflective mirror is generally in the form of a disc having opposite faces, at least one of which is a light-reflective surface, than when the reflective mirror is alternatively rectangular-shaped with the same lateral dimension.

Therefore, the apparatus according to the present mode (12) would facilitate an increase in a resonant frequency also owing to optimization of the form of the reflective mirror.

(13) The apparatus according to any one of modes (1)-(12), wherein the reflective mirror is angularly oscillated about an oscillation axis by the torsional vibration, wherein the integral spring includes a first integral spring member extending from the reflective mirror and being excited to generate at least a torsional vibration; and a second integral spring member extending from the reflective mirror and being excited to generate at least a torsional vibration, and wherein the first and second integral spring members are disposed in the vibrating body at two opposite positions to each other in a direction of the oscillation axis, respectively, with the reflective mirror being interposed between the two opposite positions.

(14) The apparatus according to mode (13), wherein the first and second integral spring members disposed at the respective two opposite positions are disposed symmetrically to each other with respect to a position of the reflective mirror.

(15) An apparatus for forming an image by scanning a light beam, comprising:

a light source emitting the light beam; and an optical scanning device having an optical scanner, scanning the light beam emitted from the light source, using the optical scanner, wherein the optical scanner, for use in optical scanning, vibrates at least a part of a vibrating body having a light-reflective surface, to thereby allow the light beam, upon entry, to be reflected from the light-reflective surface in varying directions, the vibrating body comprising:

(a) a reflective mirror having the light-reflective surface; and (b) an integral spring extending from the reflective mirror and being excited to generate at least a torsional vibration, wherein the vibrating body has vibrational characteristics in which whether or not a resonant frequency of the torsional vibration and a resonant frequency of a disturbing vibration are equal to each other depends upon a shape-defining parameter for defining a shape of the integral spring extending lengthwise, the disturbing vibration being in the form of a vibration of the integral spring other than the torsional vibration thereof, and wherein the shape-defining parameter is pre-set to fall within a range allowing the resonant frequency of the torsional vibration and the resonant frequency of the disturbing vibration to be different from each other.

This apparatus, which includes an optical scanner which is constructed as the same as the apparatus constructed according to anyone of the previous modes (1)-(14), would facilitate enhancement in resolution of a displayed image as a result of an increase in a scanning frequency, owing to the use of the thus-constructed optical scanner.

(16) The apparatus according to mode (15), wherein the optical scanning device scans the light beam on a retina of a viewer two-dimensionally, to thereby project the image onto the retina.

This apparatus would provide a so-called retinal scanning display which includes an optical scanner which is constructed as the same as the apparatus constructed according to anyone of the previous modes (1)-(14), and which would facilitate enhancement in resolution of a displayed image as a result of an increase in a scanning frequency, owing to the use of the thus-constructed optical scanner.

(17) The apparatus according to any one of modes (1)-(15), wherein the shape-defining parameter defines a lengthwise distribution of cross-sectional shapes of the integral spring, or a lengthwise cross-sectional geometry of the integral spring.

Several presently preferred embodiments of the invention will be described in more detail by reference to the drawings in which like numerals are used to indicate like elements throughout.

Referring to FIG. 1, there is schematically illustrated a retinal scanning display device including an optical scanner constructed in accordance with a first embodiment of the present invention.

The retinal scanning display device (hereinafter, abbreviated as "RSD") is adapted to direct a laser beam, through a pupil 12 of a viewer's eye 10, into an image plane on a retina 14 of the viewer, while modulating the laser beam appropriately in curvature of wavefront and intensity. The RSD is further adapted to scan the laser beam two-dimensionally on the image plane, to thereby project a desired image directly onto the retina 14.

The RSD includes a light source unit 20 and a scanning unit 24 which is disposed between the light source unit 20 and the viewer's eye 10.

In order to generate a beam of laser light of any desired color by combining sub-beams of laser light of three primary colors (i.e., red, green, and blue), the light source unit 20 includes: a laser 30 emitting a sub-beam of red colored laser light; a laser 32 emitting a sub-beam of green colored laser light; and a laser 34 emitting a sub-beam of blue colored laser light. These lasers 30, 32, and 34 each may be in the form of, for example, a semiconductor laser.

The sub-beams of laser light of three primary colors emitted from the respective lasers 30, 32, and 34, after collimation by respective collimating optical systems 40, 42, and 44, enter respective dichroic mirrors 50, 52, and 54 all of which are wavelength-selective. This is for causing the sub-beams of laser light to be selectively reflected from or transmitted through the respective dichroic mirrors 50, 52, and 54, in response to the wavelengths of these sub-beams of laser light, to thereby eventually combine the sub-beams of laser light.

More specifically, the sub-beam of red colored light emitted from the laser 30, after collimation by the collimating optical system 40, enters the dichroic mirror 50. The sub-beam of green colored light emitted from the laser 32, after collimation by the collimating optical system 42, enters the dichroic mirror 52. The sub-beam of blue colored light emitted from the laser 34, after collimation by the collimating optical system 44, enters the dichroic mirror 54.

The sub-beams of laser light of three primary colors, upon entry into the respective dichroic mirrors 50, 52, and 54, are combined together at the dichroic mirror 54, which is a representative one of the dichroic mirrors 50, 52, and 54. The combined sub-beams of laser light enter a combining optical system 56 for convergence.

Although an optical section of the light source unit 20 has been described above, then there will be described an electrical section of the light source unit 20.

The light source unit 20 includes a signal processing circuit 60 principally made up with a computer. The signal processing circuit 60 is configured to perform, in response to an externally-supplied video signal, signal processing for driving the lasers 30, 32, and 34; and signal processing for implementing a scanning operation of the combined beam of laser.

In operation, the signal processing circuit 60 supplies drive signals for driving the lasers 30, 32, and 34, in response to an externally-supplied video signal, for a desired image to be projected onto the retina 14 on a pixel-by-pixel basis. These drive signals, which are required for a desired color and intensity of the combined beam of laser, are routed to the corresponding respective lasers 30, 32, and 34 via corresponding respective laser drivers 70, 72, and 74. The signal processing for scanning the laser beam will be described below.

The light source unit 20 described above permits the combined beam of laser, after a convergence thereof on the combining optical system 56, to enter an optical fiber 82. The laser beam thus entering the optical fiber 82 is transmitted through the optical fiber 82 and passed through a collimating optical system 84 into a wavefront-curvature modulating optical system 22. The optical fiber 82 functions as a light transmissive media or optical guide, and the collimating optical system 84 collimates the laser beam exiting the optical fiber 82 divergently at its rearward end.

The wavefront-curvature modulating optical system 22 is an optical system modulating the curvature of wavefront of the laser beam exiting the light source unit 20. The wavefront-curvature modulating optical system 22 may be of a type in which the wavefront curvature is modulated for per pixel of an image to be projected onto the retina 14; however, it is inessential in practicing the present invention, and the wavefront-curvature modulating optical system 22 may alternatively be of a type in which the wavefront curvature is modulated for per frame of an image. The modulation of the wavefront curvature means adjustment to a depth perception or a point of focus of an image to be displayed.

In either case, the wavefront-curvature modulating optical system 22 modulates the wavefront curvature of the laser beam incident thereon on the basis of a depth signal entered from the signal processing circuit 60. In the wavefront-curvature modulating optical system 22, the laser beam is, upon incident thereon from the collimating optical system 84 in the form of parallel light, transformed into converging light by a converging lens 90. The thus-transformed converging light is reflected from a movable mirror 92, resulting in transformation into diverging light. The thus-transformed diverging light, upon passing through the converging lens 90, exits the wavefront-curvature modulating optical system 22, as a laser beam having a target wavefront-curvature.

As illustrated in FIG. 1, the wavefront-curvature modulating optical system 22 includes: a beam splitter 94 causing the externally-entered laser beam to be reflected from or passed through; the converging lens 90 converging the laser beam entered via the beam splitter 94; and the movable mirror 92 reflecting the laser beam converged by the converging lens 90.

The wavefront-curvature modulating optical system 22 further includes an actuator 96 displacing the movable mirror 92 in directions in which the movable mirror 92 moves toward or apart from the converging lens 90. One of examples of the actuator 96 is a piezoelectric element. The actuator 96 moves a position of the movable mirror 92 in response to the depth signal entered from the signal processing circuit 60, to thereby modulate the wavefront curvature of the laser beam exiting the wavefront-curvature modulating optical system 22.

In the wavefront-curvature modulating optical system 22 constructed as mentioned above, a laser beam incoming from the collimating optical system 84, after being reflected by the beam splitter 94 and then passed through the converging lens 90, is reflected from the movable mirror 92. Then, the laser beam is passed through the converging lens 90 again and thereafter transmitted through the beam splitter 94 toward the scanning unit 24.

The scanning unit 24 includes a horizontal scanning sub-system 100 and a vertical scanning sub-system 102.

The horizontal scanning sub-system 100 is an optical system for performing horizontal scan in the form of raster scan in which a laser beam is scanned along a plurality of horizontal scan lines, on a frame-by-frame basis, for an image to be displayed. In contrast, the vertical scanning sub-system 102 is an optical system for performing vertical scan in which a laser beam is scanned vertically from the first scan line to the last scan line, on a frame-by-frame basis, for an image to be displayed.

The horizontal scanning sub-system 100 is configured to scan a laser beam at a rate or frequency higher than that of the vertical scanning sub-system 102.

More specifically, in the present embodiment, the horizontal scanning sub-system 100 includes an optical scanner 104. The optical scanner 104 has an elastic material provided with a mirror for performing mechanical deflection. The mirror is angularly oscillated by vibration of the elastic material. The optical scanner 104 is controlled in response to a horizontal sync signal supplied from the signal processing circuit 60.

Figure 2:
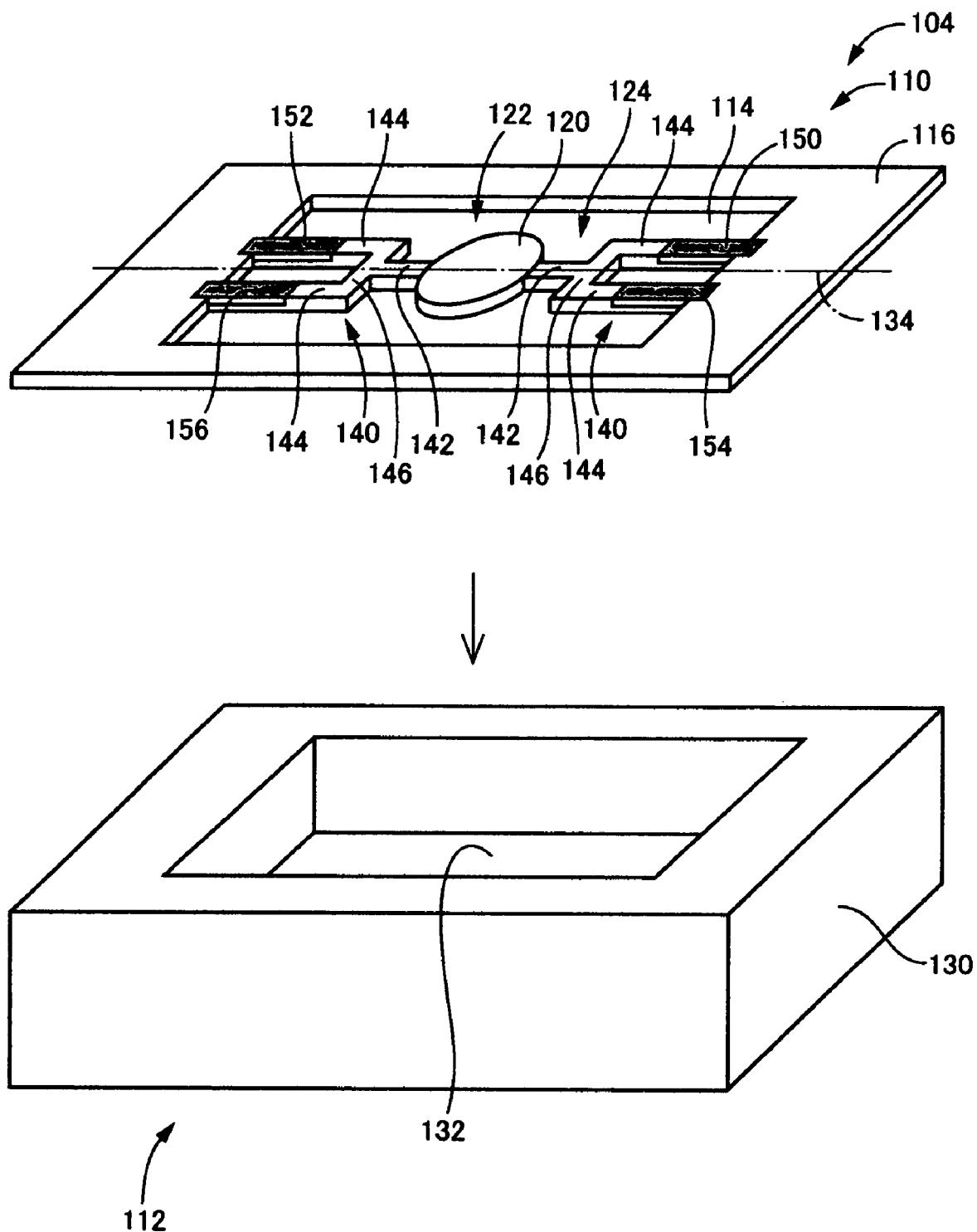
FIG. 2 is an exploded perspective view illustrating the optical scanner 104 depicted in FIG. 1.

FIG. 2 illustrates the optical scanner 104 in exploded perspective view. As illustrated in FIG. 2, the optical scanner 104 is constructed by attaching a main body 110 to a base 112.

The main body 110 is monolithically made up of a material having elasticity such as silicon. As illustrated at the top of FIG. 2, the main body 110 is generally in the form of an elongate-rectangular thin-plate having a through hole 114 allowing light to pass therethrough. The main body 110 includes, in an outer area thereof, a stationary frame 116, and on the other hand, includes, in an inner area thereof, a vibrating body 124 having a reflective mirror 122 at which a reflective surface 120 is formed.

To accommodate this configuration of the main body 110, the base 112, as illustrated at the bottom of FIG. 2, is configured to include a support 130 on which the stationary frame 116 is to be mounted, with the base 112 being attached to the main body 110. The base 112 is further configured to also include a recess 132 opposing to the vibrating body 124. The recess 132 is shaped in the base 112 for providing a clearance allowing angular oscillation of the vibrating body 124 by vibration without interference with the base 112, with the main body 110 being attached to the base 112.

As illustrated in FIG. 2, the reflective surface 120 of the reflective mirror 122 is angularly oscillated about an oscillation axis 134 which is also a line of symmetry of the reflective surface 120. The vibrating body 124 further includes a pair of integral or composite springs 140, 140 each reversely extending from the reflective mirror 122 in a coplanar arrangement for allowing connection of the reflective mirror 122 with the stationary frame 116. In the present embodiment, the pair of integral springs 140, 140 extend out of opposite lateral faces of the reflective mirror 122 in opposite directions, respectively. The reflective mirror 122 and the pair of integral springs 140, 140 are each in the form of a thin-plate and are disposed in a coplanar arrangement.

Each integral spring 140 is configured to include a mirror-side leaf spring 142, a pair of frame-side leaf springs 144, 144, and a connection 146 interconnecting the mirror-side leaf spring 142 and the pair of frame-side leaf springs 144, 144. Each mirror-side leaf spring 142, belonging to a corresponding one of the pair of integral springs 140, 140, extends from a corresponding one of the lateral faces of the reflective mirror 122 which are opposed to each other in the direction of the oscillation axis 134. Each mirror-side leaf spring 142 extends from the corresponding lateral face into a corresponding one of the connections 146, 146 in and along the oscillation axis 134.

The pair of frame-side leaf springs 144, 144, belonging to a corresponding one of the pair of integral springs 140, 140, coextend from a corresponding one of the connections 146, 146 along the oscillation axis 134, with the frame-side leaf springs 144, 144 being offset in opposite directions from the oscillation axis 134 in a plane in which the frame-side leaf springs 144, 144 are both confined (i.e., with the frame-side leaf springs 144, 144 being laterally spaced apart).

Figure 3:
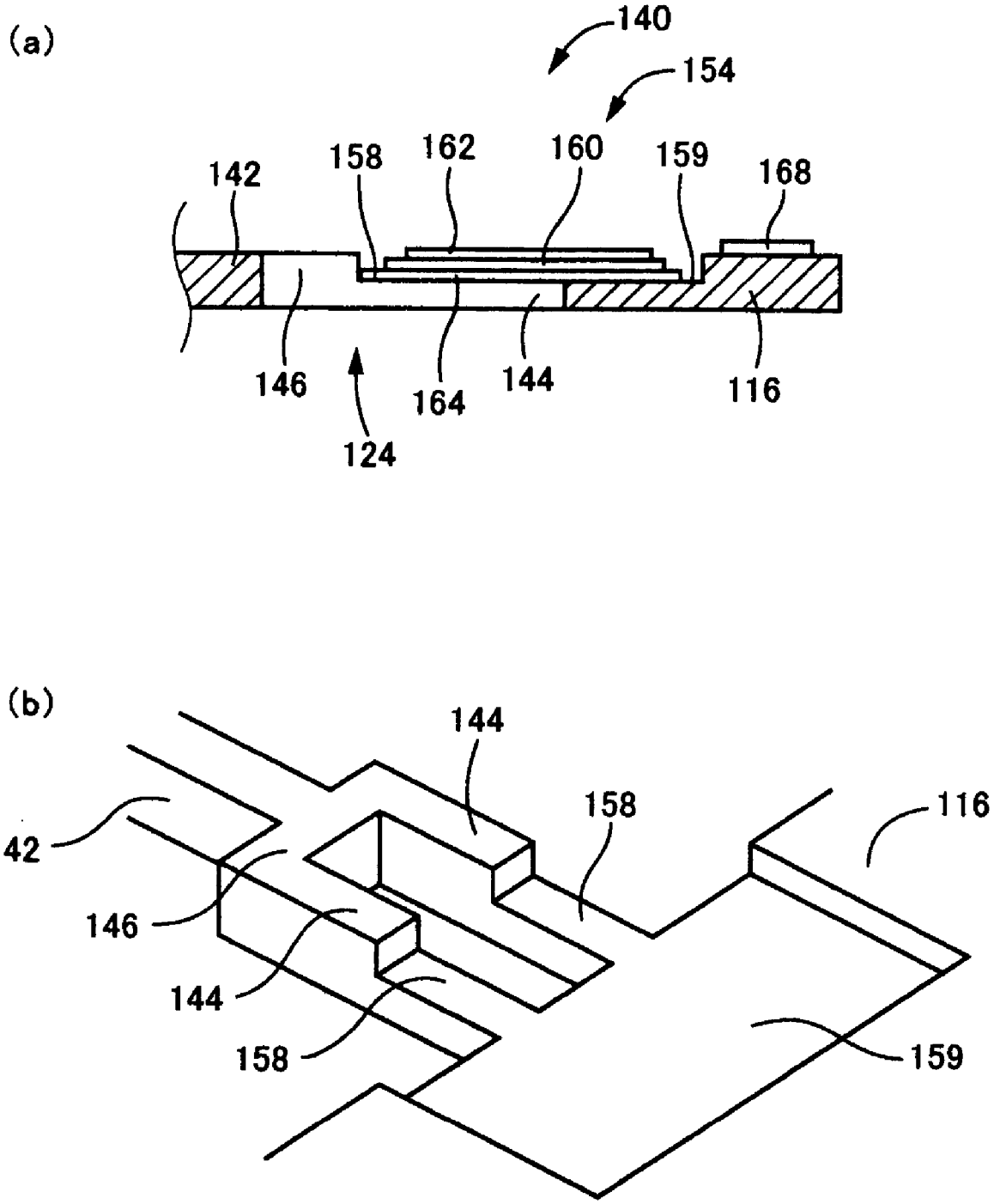
FIG. 3 illustrates in sectional and perspective views an actuator 154 depicted in FIG. 2 along with a periphery of the actuator 154.

As illustrated in FIGS. 2 and 3, for each integral spring 140, actuators 150 and 152 or 154 and 156 are attached to the pair of frame-side leaf springs 144, 144, respectively, such that the actuators 150, 152, 154, and 156 extend to the stationary frame 116.

As illustrated in FIG. 3, each frame-side leaf spring 144 is locally thinned on a proximal side to the stationary frame 116, resulting in the formation of a recess 158. Adjacent to the recess 158, a recess 159 is formed on the stationary frame 116. The use of these recesses 158 and 159 allows each one of the actuators 150, 152, 154, and 156 to be mounted on each frame-side leaf spring 144 and the stationary frame 116, so as to extend therebetween.

As the actuator 154 representatively illustrated in FIG. 3, these actuators 150, 152, 154, and 156 are each fabricated principally with a piezoelectric material 160 (which is also referred to as "piezoelectric vibrator" or "piezoelectric element"). The piezoelectric material 160 is attached to one of both sides of the vibrating body 124, in the form of a thin plate, and is sandwiched between an upper electrode 162 and a lower electrode 164 which are opposed in a direction perpendicular to the plane of the vibrating body 124 onto which the piezoelectric material 160 is attached.

As illustrated in FIG. 3, the upper electrode 162 and the lower electrode 164 are connected via corresponding respective lead wires not illustrated, to a pair of terminals 168, 168 disposed at the stationary frame 116. In contrast, the present invention may alternatively be practiced in a mode in which the upper electrode 162 and the lower electrode 164 are connected via the corresponding respective lead wires not illustrated, to external terminals not either illustrated.

Figure 4:
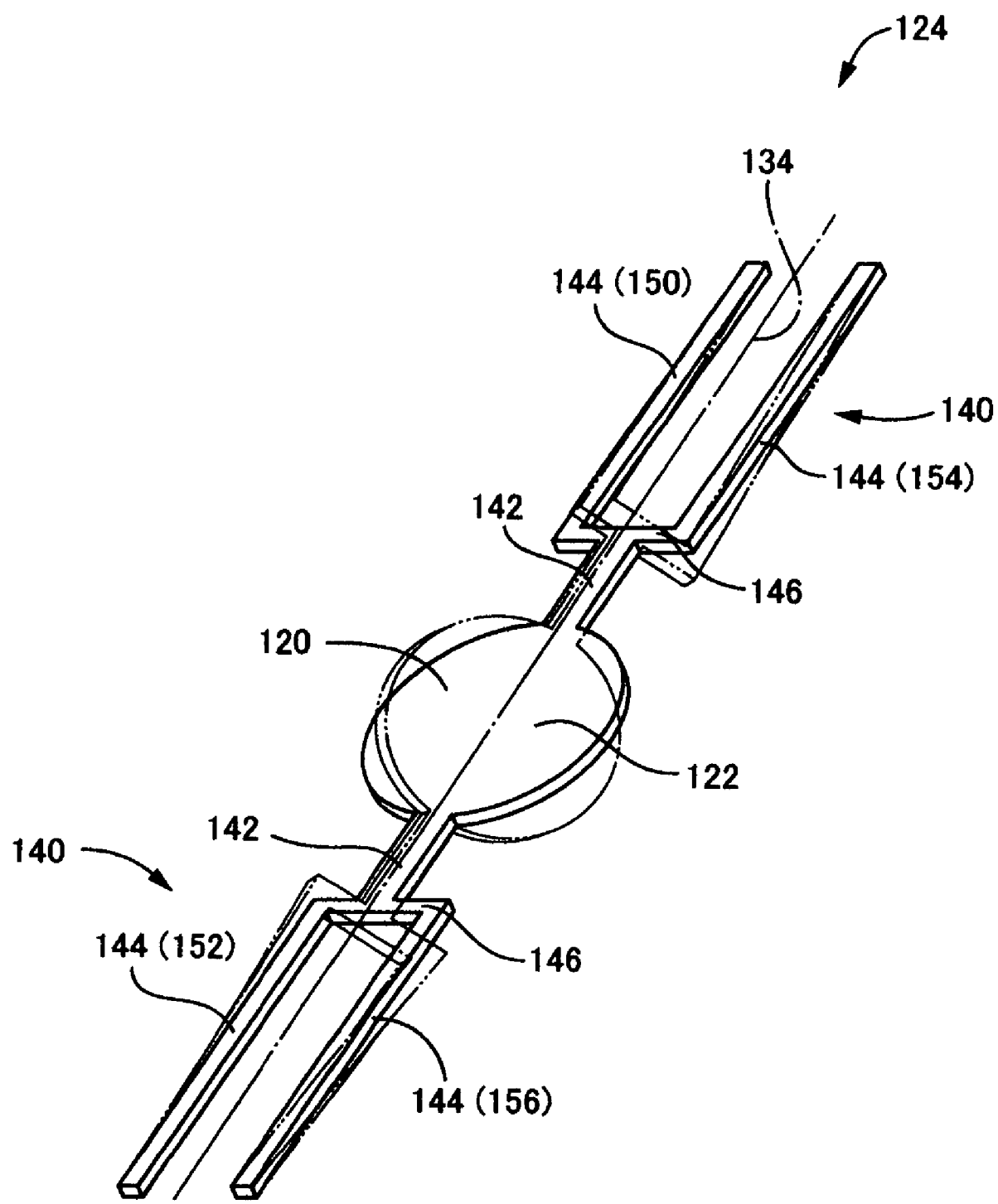
FIG. 4 is a perspective view illustrating a vibrating body 124 depicted in FIG. 2.

Application of a voltage to these upper and lower electrodes 162, 164 causes the piezoelectric material 160 to produce mechanical distortion in a direction perpendicular to that in which the voltage is applied. As illustrated in FIG. 4, the distortion or displacement causes each integral spring 140 to produce flexure or deflection. The flexure is produced such that a connection of each integral spring 140 with the stationary frame 116 acts as a fixed end, while a connection of each integral spring 140 with the reflective mirror 122 acts as a free end. As a result, the free end displaces upwardly or downwardly depending on whether the flexure is produced upwardly or downwardly.

As is evident from FIG. 4, among the four actuators 150, 152, 154, and 156 attached to the four frame-side leaf springs 144, 144, 144, and 144, respectively, a pair of the actuators 150 and 152 are located on one of both sides with respect to the oscillation axis 134, with the reflective mirror 122 being interposed between these actuators 150 and 152, while a pair of the actuators 154 and 156 are located on the other side, with the reflective mirror 122 being interposed between these actuators 154 and 156. The pair of actuators 150 and 152 are deflected such that free ends of the corresponding respective two piezoelectric materials 160 and 160 are displaced in the same direction, and similarly, the pair of actuators 154 and 156 are deflected such that free ends of the corresponding respective two piezoelectric materials 160 and 160 are displaced in the same direction.

In contrast, a pair of the actuators 150 and 154 are located on one of both sides with respect to the reflective mirror 122, with the oscillation axis 134 being interposed between these actuators 150 and 154, while a pair of the actuators 152 and 156 are located on the other side, with the oscillation axis 134 being interposed between these actuators 152 and 156. The pair of actuators 150 and 154 are deflected such that free ends of the corresponding respective two piezoelectric materials 160 and 160 are displaced in opposite directions, and similarly, the pair of actuators 152 and 156 are deflected such that free ends of the corresponding respective two piezoelectric materials 160 and 160 are displaced in opposite directions.

As illustrated in FIG. 4, as a result of the above-described relative displacement, the reflective mirror 122 is rotated in an alternately-selected one of opposite rotational directions, owing to both the displacement produced in a first direction by the pair of actuators 150 and 152 located on one of both sides with respect to the oscillation axis 134, and the displacement produced in a second direction by the pair of actuators 154 and 156 located on the other side, wherein the second direction is opposite to the first direction.

That is to say, each frame-side leaf spring 144 has the function to convert linear displacement (transverse displacement) of the piezoelectric material 160 attached to each frame-side leaf spring 144 into a flexure or bending motion (longitudinal displacement) thereof, while each connection 146 has the function to convert the flexure or bending motion of each frame-side leaf spring 144 into a rotary motion of each mirror-side leaf spring 142. The rotary motion of the mirror-side leaf spring 142 causes the rotation of the reflective mirror 122.

Therefore, in the present embodiment, for controlling the four actuators 150, 152, 154, and 156, the two actuators 150 and 152, which are positioned on one of both sides with respect to the oscillation axis 134, that is, the upper right-hand actuator 150 and the upper left-hand actuator 152 as illustrated in FIG. 2 constitute a first pair. In addition, the two actuators 154 and 156, which are positioned on the opposite side, that is, the lower right-hand actuator 154 and the lower left-hand actuator 156 as illustrated in FIG. 2 constitute a second pair.

In the present embodiment, first voltages alternating in the same phase are applied to the two actuators 150 and 152 constituting the first pair, respectively, and second voltages alternating in the same phase are applied to the two remaining actuators 154 and 156 constituting the second pair, respectively, with the first and second voltages being opposite in phase.

This voltage application is performed for deflecting the first and second pairs in opposite directions, to thereby cause the reflective mirror 122 to produce reciprocal rotation, that is, angular oscillation about the oscillation axis 134. As a result, when both the two actuators 150 and 152 constituting the first pair are concurrently deflected downwardly as illustrated in FIG. 2, both the two remaining actuators 154 and 156 constituting the second pair are concurrently deflected upwardly as illustrated in FIG. 2.

Figure 5:
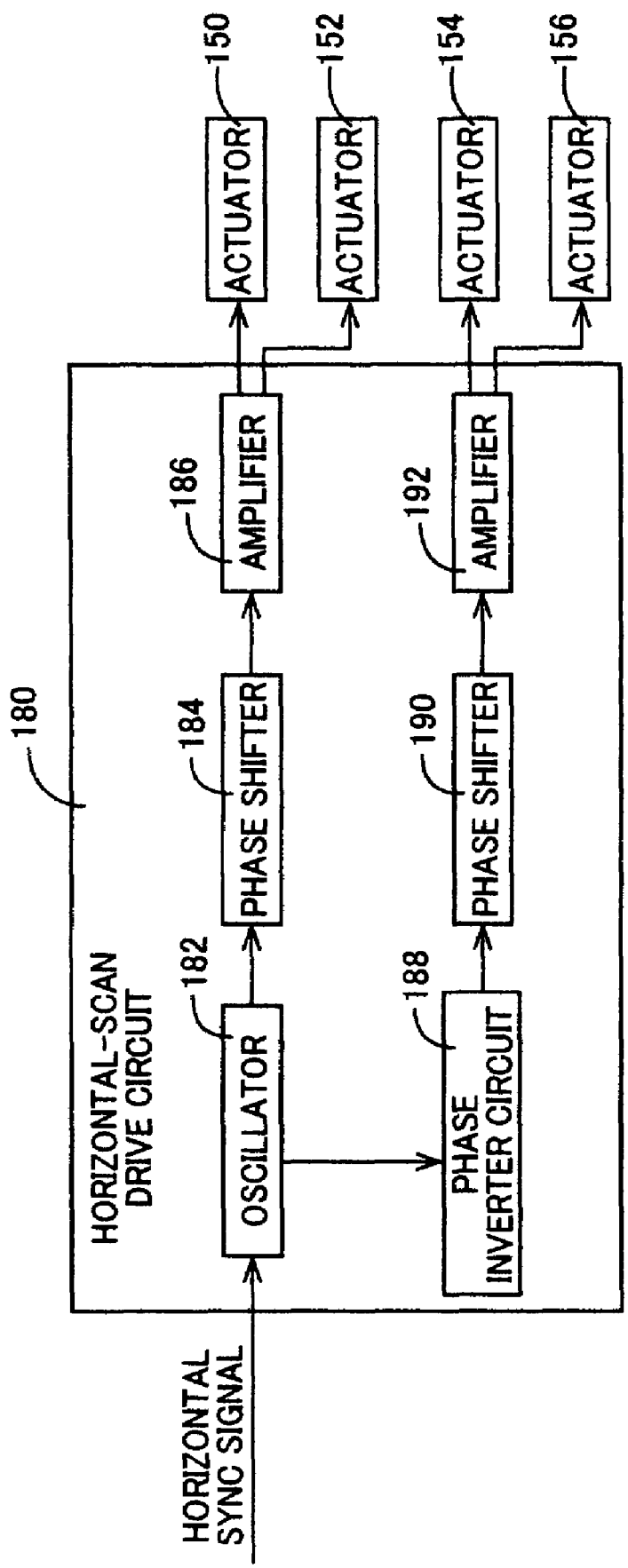
FIG. 5 is a block diagram illustrating the internal configuration of a horizontal-scan drive circuit 180 depicted in FIG. 1, and the connection between the horizontal-scan drive circuit 180 and external elements.

In order to achieve the above-described control, the horizontal scanning sub-system 100 includes a horizontal-scan drive circuit 180 illustrated in FIG. 1. For the horizontal-scan drive circuit 180, as illustrated in FIG. 5, an oscillator 182 generates an alternating voltage signal in response to the horizontal sync signal entered from the signal processing circuit 60. The oscillator 182 is electrically coupled to the two actuators 150 and 152 constituting the first pair, via a first electrical pathway through a phase shifter 184 and an amplifier 186. The oscillator 182 is also electrically coupled to the two actuators 154 and 156 constituting the second pair, via a second electrical pathway through a phase inverter circuit 188, a phase shifter 190, and an amplifier 192.

The phase inverter circuit 188 is adapted to invert in phase the alternating voltage signal, upon receipt from the oscillator 182, and supplies the inverted alternating voltage signal to the phase shifter 190. Because the phase inverter circuit 188 is provided only for the second electrical pathway, the two actuators 150 and 152 constituting the first pair and the two remaining actuators 154 and 156 constituting the second pair are opposite in the phase of the alternating voltage signals supplied from the corresponding respective amplifiers 186 and 192.

The phase shifters 184 and 190 are provided for the function, which is in common to both the first and second electrical pathways, that the alternating voltage signals to be supplied to the actuators 150, 152, 154, and 156 are varied in phase for successful synchronization between the video signal and the oscillation of the reflective mirror 122.

It is added that, in the present embodiment, although the four actuators 150, 152, 154, and 156 are mounted on the same vibrating body 124, concurrent activation of all these actuators 150, 152, 154, and 156 is inessential for providing the optical scan by the resonant vibration of the vibrating body 124. The reason is that, even if only one of the four actuators 150, 152, 154, and 156 is activated, imparting to the vibrating body 124 a vibration in conformity with a resonant frequency of the vibrating body 124 excites a mode for optical scan, to thereby cause the vibrating body 124 to generate a rotary motion about the oscillation axis.

As illustrated in FIG. 1, the laser beam, upon scanned horizontally by the optical scanner 104 described above, is directed to the vertical scanning sub-system 102 by a relay optical system 194.

This RSD is provided with a beam detector 200 at a fixed position relative to this RSD. The beam detector 200 detects a laser beam which has been deflected by the optical scanner 104, to thereby measure the position of the scanned laser beam in the horizontal scan direction. An example of the beam detector 200 may be a photodiode.

The beam detector 200 outputs a BD signal indicating that a scanned laser beam has reached a predetermined position, and the output BD signal is delivered to the signal processing circuit 60. In response to the delivery of the BD signal from the beam detector 200, the signal processing circuit 60 supplies appropriate drive signals to the respective laser drivers 70, 72, and 74, upon elapse of a predetermined length of time since the beam detector 200 detected latest the laser beam. This identifies the timing at which displaying an image is to be started on a per scan-line basis, and at the start timing, displaying an image is started on a per scan-line basis.

Although the horizontal scanning sub-system 100 has been described above, the vertical scanning sub-system 102, as illustrated in FIG. 1, includes a galvanometer mirror 210 as an oscillating mirror that causes mechanical deflection of a laser beam incident thereon. The galvanometer mirror 210 is disposed to allow entry into the galvanometer mirror 210 of a laser beam after exiting the horizontal scanning sub-system 100 and being converged by the relay optical system 194. The galvanometer mirror 210 is oscillated about an axis of rotation intersecting with respect to the optical axis of the laser beam entering the galvanometer mirror 210. The start-up timing and the rotational speed of the galvanometer mirror 210 is controlled in response to a vertical sync signal supplied from the signal processing circuit 60.

The horizontal scanning sub-system 100 and the vertical scanning sub-system 102 both described above cooperate together to scan a laser beam two-dimensionally, and image light formed by the scanned laser beam enters the viewer's eye 10 via a relay optical system 214.

Figure 6:
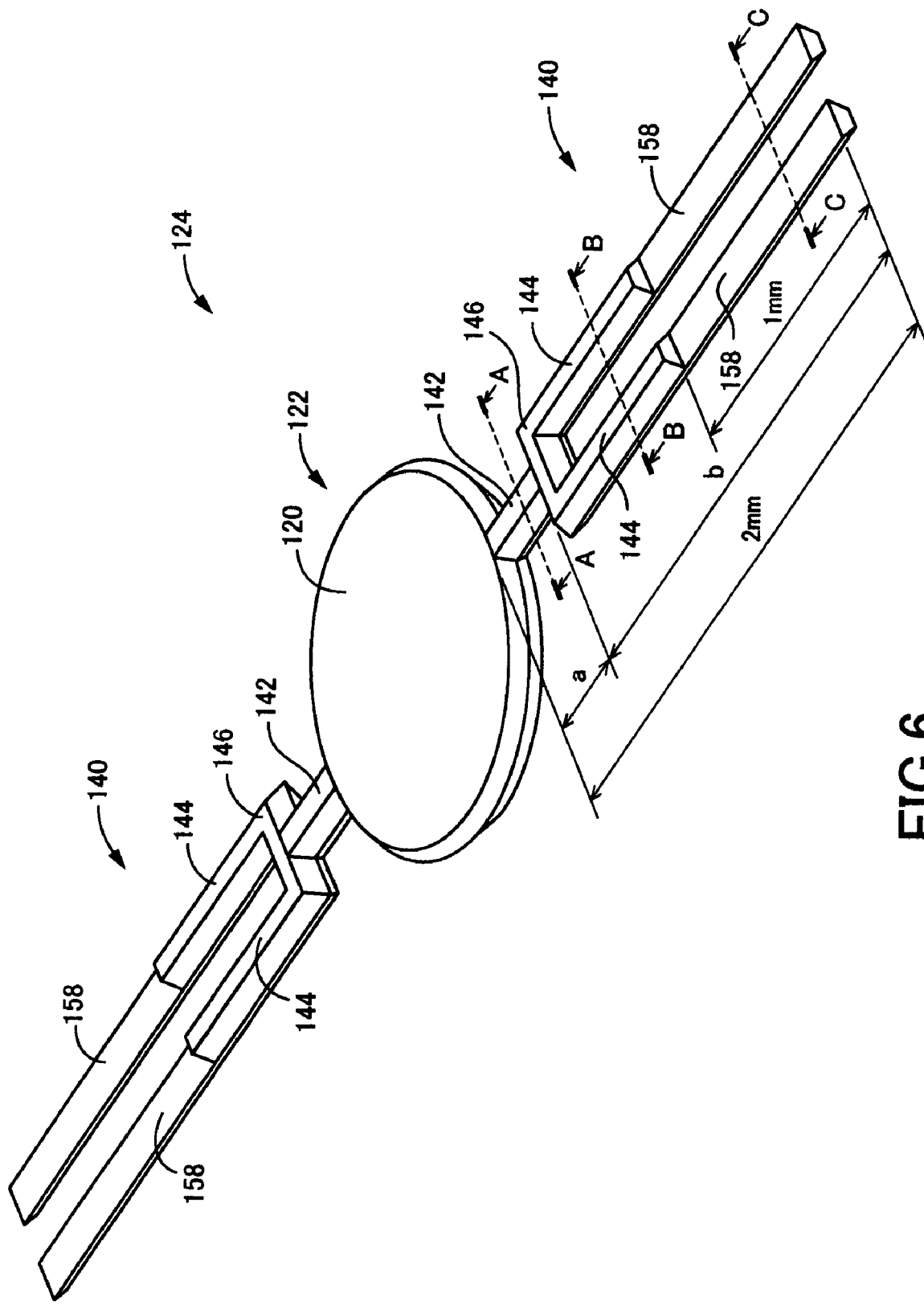
FIG. 6 is a perspective view illustrating the vibrating body 124 depicted in FIG. 2.

FIG. 6 is a perspective view illustrating a detailed shape of the vibrating body 124. Although the vibrating body 124 includes the pair of integral springs 140, 140 in a manner in which the reflective mirror 122 is interposed between the pair of integral springs 140, 140, there will be representatively described in shape only one of the pair of integral springs 140, 140 located on the right-hand side of FIG. 6.

Because the length of each integral spring 140 and the length of each recess 158 are the length depending on the length of the stationary frame 116, and the length dependent on the length of each actuator 150, 152, 154, 156, respectively, the length of each integral spring 140 and the length of each recess 158 each have a pre-established fixed value. More specifically, each integral spring 140 has a pre-established length of 2 mm, while each recess 158 has a pre-established length of 1 mm.

In contrast, the length of each mirror-side leaf spring 142 and the length of each frame-side leaf spring 144 each have a variable, provided that a total length of each mirror-side leaf spring 142 and each frame-side leaf spring 144 is equal to 2 mm. The lengths of each mirror-side leaf spring 142 and each frame-side leaf spring 144 will be denoted by lengths "a" and "b," respectively. Further, a percentage of the length of each frame-side leaf spring 144 to the length of each integral spring 140 will be denoted by a length ratio "γ." Accordingly, where the unit of each of the lengths "a" and "b" is μm, the length ratio "γ" is defined by the expression:

$$\gamma = (b/(a+b))*100 = (b/2000)*100.$$

Figure 7:
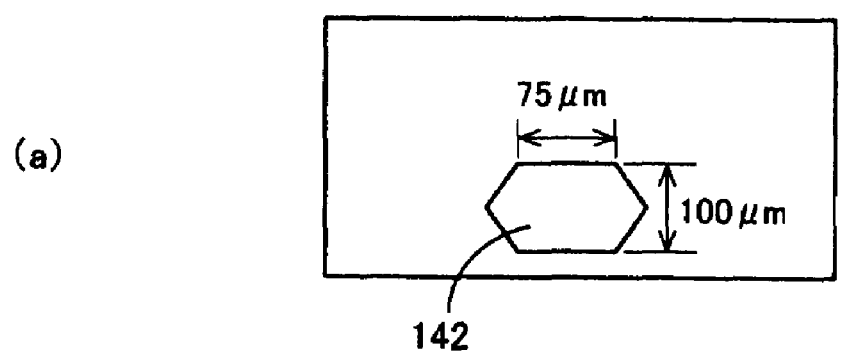
FIG. 7 is a sectional view illustrating each segment of the vibrating body 124 depicted in FIG. 6.
Figure 7:
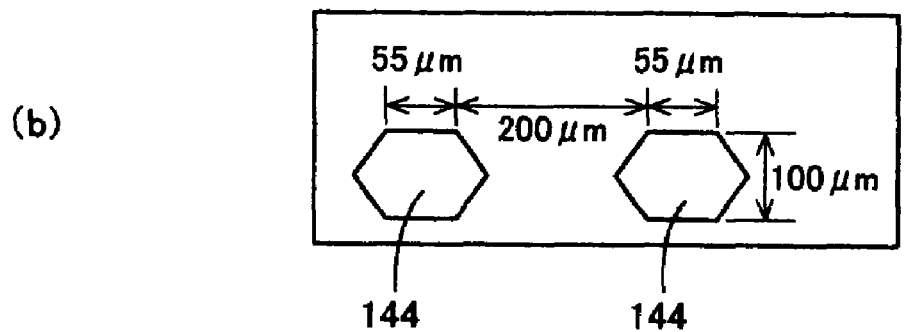
Figure 7:
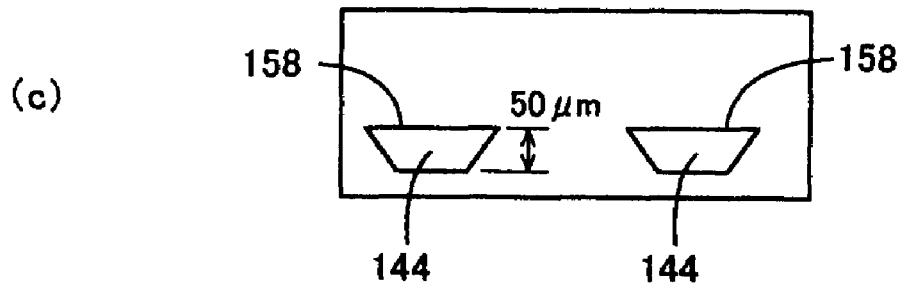

FIG. 7 illustrates cross section of each segment of each integral spring 140. A fundamental cross section of each integral spring 140 is shaped as a hexagon shape having opposite sides extending parallel to each other. FIG. 7(*a*), which is a cross section taken on line A-A in FIG. 6, illustrates a cross section of each mirror-side leaf spring 142. FIG. 7(*b*), which is a cross section taken on line B-B in FIG. 6, illustrates a cross section of a portion of each frame-side leaf spring 144 in which the corresponding recess 158 is not formed. FIG. 7(*c*), which is a cross section taken on line C-C in FIG. 6, illustrates a cross section of a portion of each frame-side leaf spring 144 in which the corresponding recess 158 is formed.

Further, in the present embodiment, the reflective mirror 122 has a pre-established diameter of 1 mm, and a pre-established thickness of 100 μm.

The present inventors conducted an analysis of a vibration of the vibrating body 124 having the dimensions and the shapes as described above, through a simulation using a computer. The analysis was repeated for various values of the length ratio "γ." As a result, the present inventors found that, as graphed in FIG. 8, there were exhibited a plurality of vibrational modes for the vibrating body 124, one of which was a torsional vibration required for optical scan by the optical scanner 104, and a resonant frequency of the torsional vibration was approximately 30 kHz.

Figure 8:
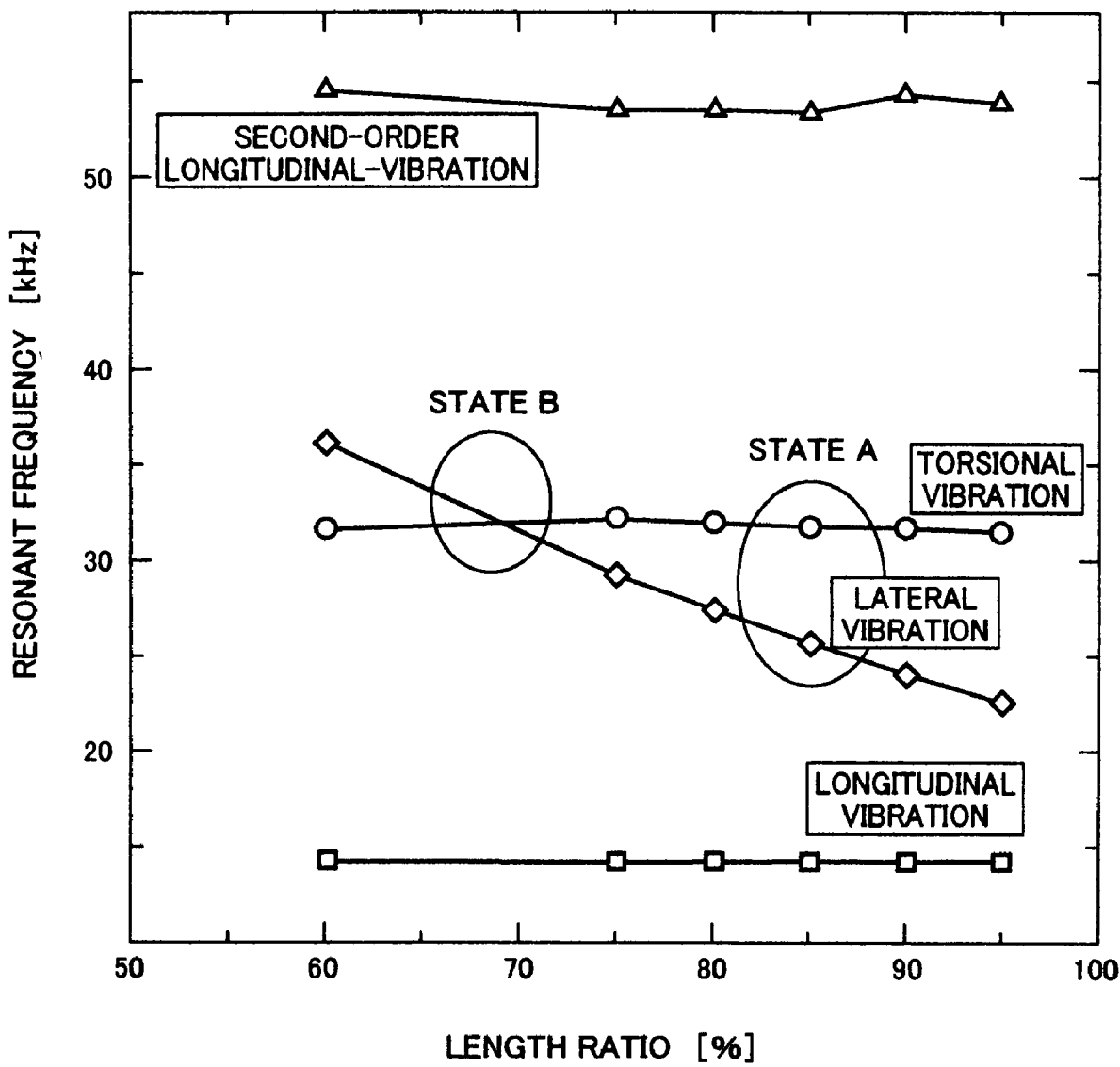
FIG. 8 is a graph indicating a relationship between resonant frequencies and length ratios of the vibrating body 124 depicted in FIG. 6.

Ones of a plurality of vibrations generated by the vibrating body 124 which are other than the torsional vibration are disturbing vibrations, and ones of those disturbing vibrations which have resonant frequencies close to the resonant frequency of the torsional vibration are a longitudinal vibration (a first-order vibration); a lateral vibration (a first-order vibration); and a second-order longitudinal-vibration (a second-order vibration), as graphed in FIG. 8.

Figure 9:
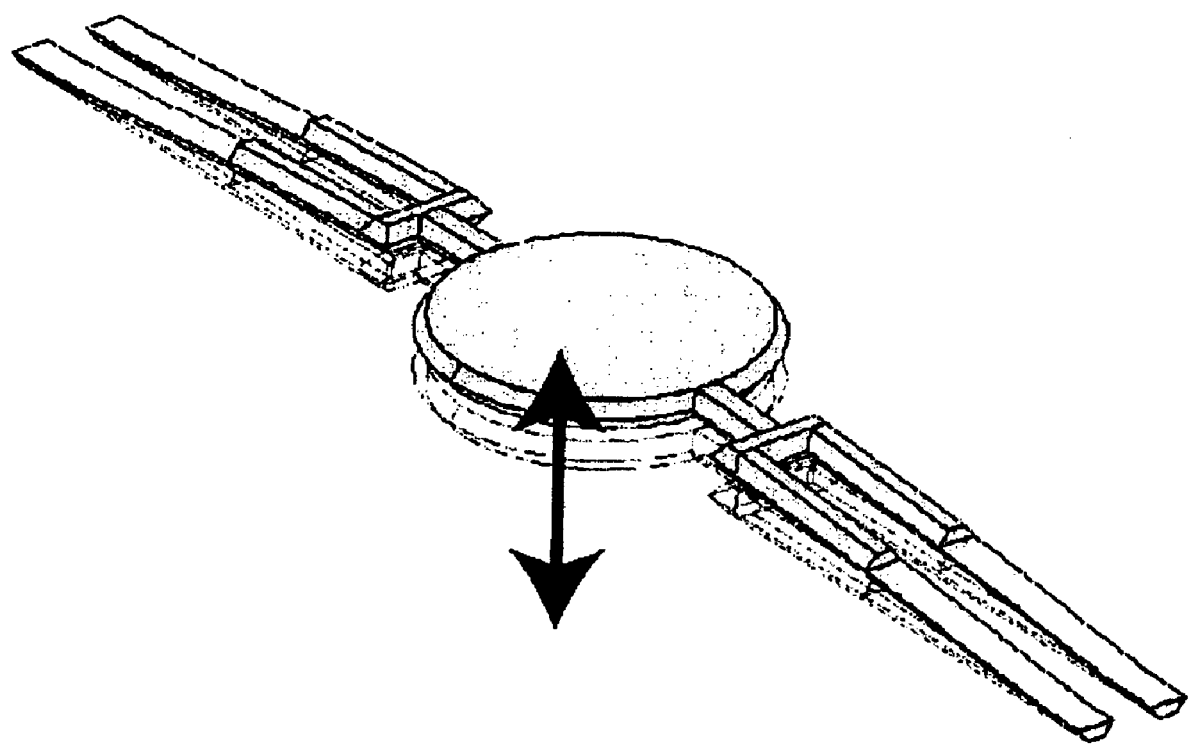
FIG. 9 is a perspective view for explaining a longitudinal vibration mode indicated in FIG. 8.
Figure 10:
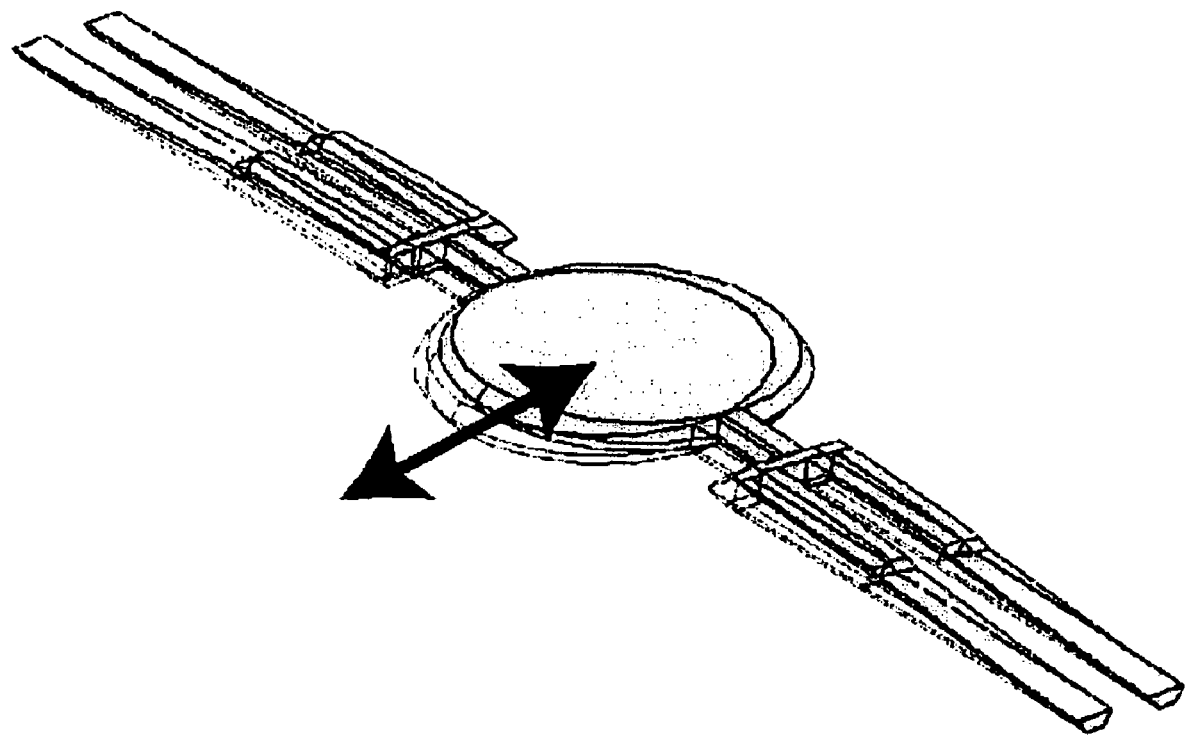
FIG. 10 is a perspective view for explaining a lateral vibration mode indicated in FIG. 8.
Figure 11:
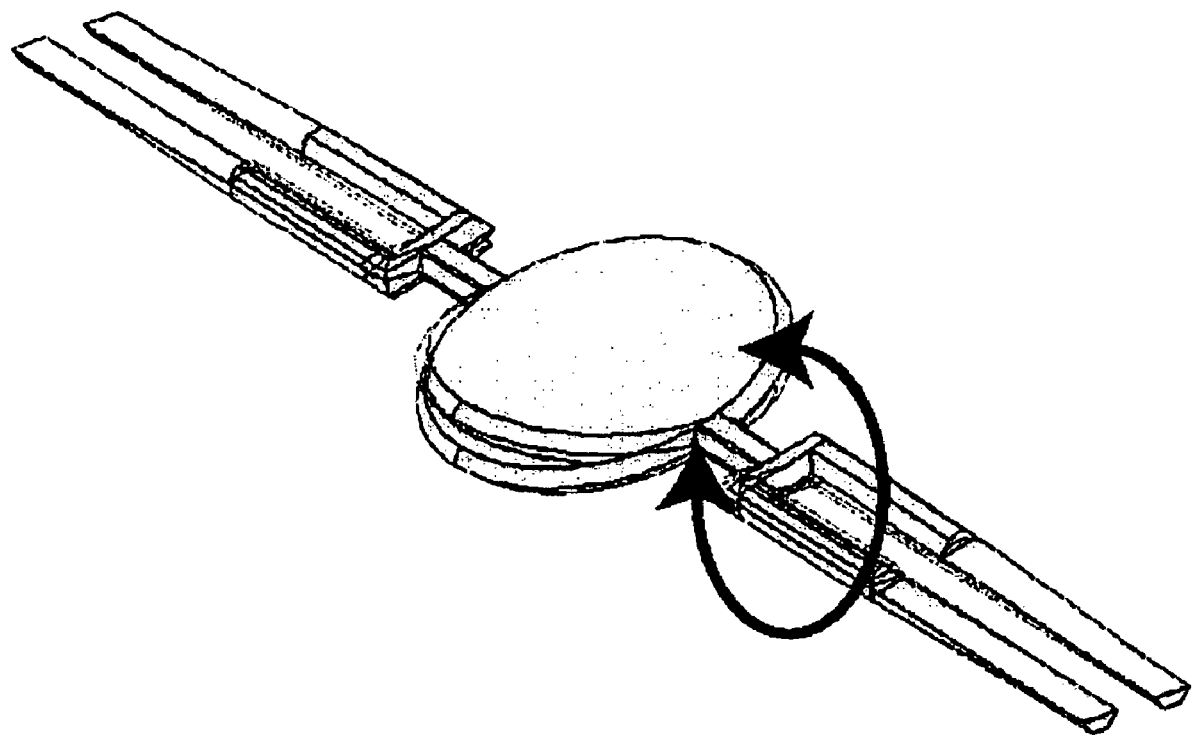
FIG. 11 is a perspective view for explaining a torsional vibration mode indicated in FIG. 8.
Figure 12:
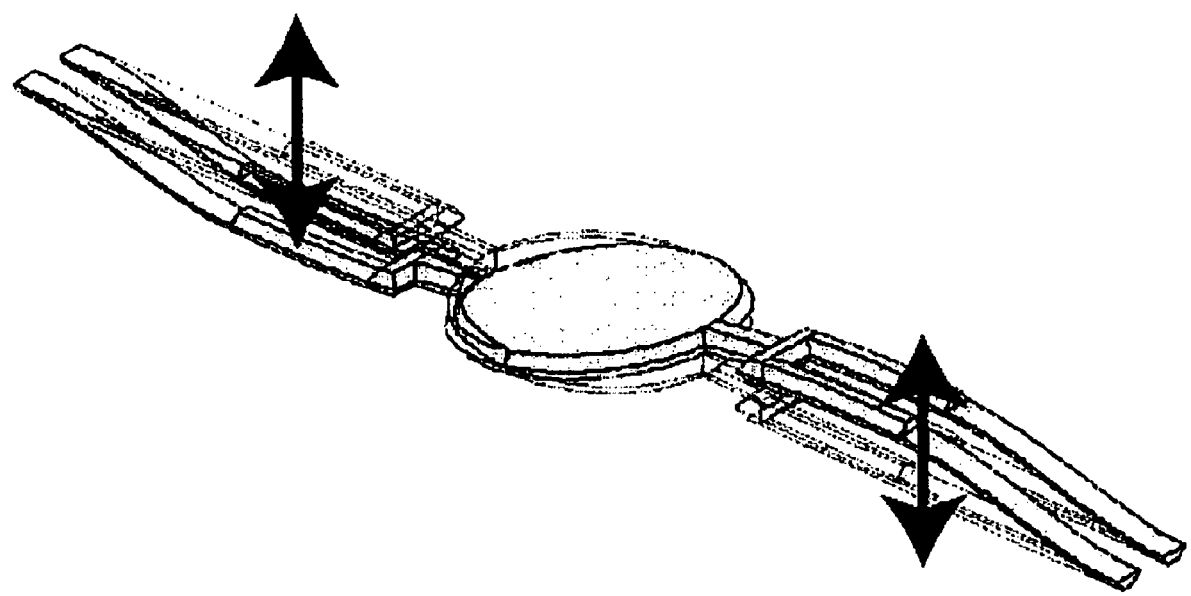
FIG. 12 is a perspective view for explaining a second-order longitudinal-vibration mode indicated in FIG. 8.

As illustrated in FIG. 9, the longitudinal vibration is a phenomenon in which the reflective mirror 122 produces a linear reciprocal motion in a direction normal to the reflective surface 120. The longitudinal vibration is a first-order vibration in a mode or wave having one anti-node and two nodes. As illustrated in FIG. 10, the lateral vibration is a phenomenon in which the reflective mirror 122 produces a linear reciprocal motion in a direction tangential to the reflective surface 120. As illustrated in FIG. 11, the torsional vibration is a phenomenon in which the reflective mirror 122 angularly oscillates about the oscillation axis 134. As illustrated in FIG. 12, the second-order longitudinal-vibration is a second-order vibration in a mode or wave having two anti-nodes and three nodes.

As illustrated in FIG. 8, the resonant frequency of the torsional vibration was kept almost constant, regardless of a variation of the length ratio "γ." In contrast, the resonant frequency of the lateral vibration increased with a decrease in the length ratio "γ" and, where the length ratio "γ" was equal to approximately 70 percent, the resonant frequency of the lateral vibration coincided with that of the torsional vibration. That is to say, in the present embodiment, the selection of approximately 70 percent of the length ratio "γ" allows the torsional vibration and the lateral vibration to become equal in resonant frequency to each other.

Returning now to FIG. 8, there is indicated a state in which the resonant frequencies of the torsional vibration and the lateral vibration are sufficiently separate from each other, denoted by state A, and there is indicated a state those resonant frequencies are equal to each other, denoted by state B.

Figure 13:
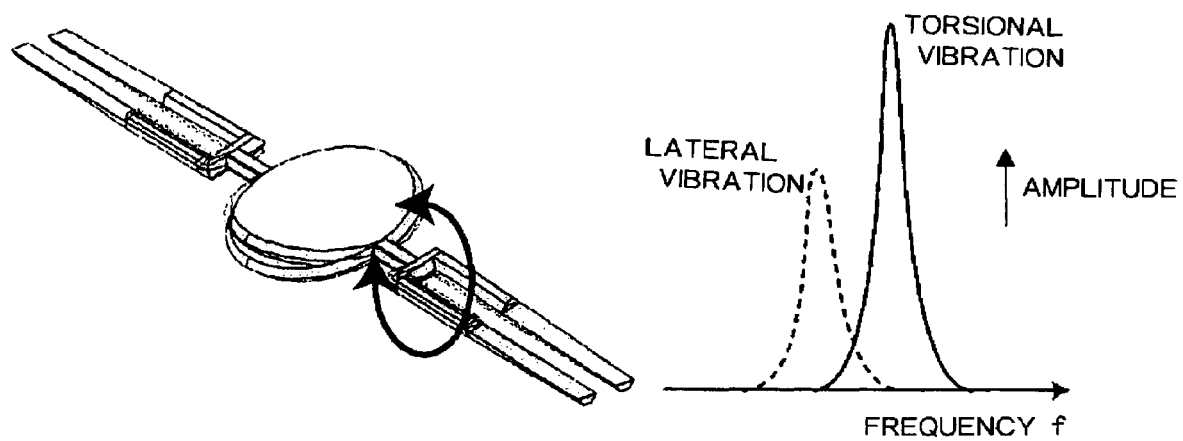
FIG. 13 is a perspective view and a graph for explaining the vibration of the vibrating body 124 in state A indicated in FIG. 8.

FIG. 13 illustrates in perspective view and graph the vibrations of the vibrating body 124 in state A. In state A, as graphed in FIG. 13, when the vibrating body 124 is excited at a frequency equal to the resonant frequency of the torsional vibration, the vibrating body 124 generates the torsional vibration at the vibrational frequency (resonant frequency) with a maximum intensity, while generating no lateral vibration or a slight lateral vibration, if any.

Therefore, in state A, as illustrated in FIG. 13 in perspective view, when the vibrating body 124 is excited at a frequency equal to the resonant frequency of the torsional vibration, the vibrating body 124 is solely angularly oscillated about the oscillation axis 134. Accordingly, in state A, only the torsional vibration required for the optical scan is excited on the vibrating body 124.

In the present embodiment, a resonant frequency difference between the torsional and lateral vibrations is pre-established so that the vibrating body 124, upon excited at a frequency equal to the resonant frequency of the torsional vibration, may generate only the torsional vibration, without generating any lateral vibration. The resonant frequency difference is preferably equal to or more than approximately 1 kHz.

As illustrated in FIG. 8, in the present embodiment, the resonant frequency difference between the torsional and lateral vibrations increases as the length ratio "γ" increases from approximately 70 percent, and similarly, the resonant frequency difference increases as the length ratio "γ" decreases from approximately 70 percent.

Then, in the present embodiment, the length ratio "γ" has, for example, a pre-established value equal to or higher than approximately 75 percent or a pre-established value equal to or lower than approximately 65 percent, more preferably, a pre-established value equal to or higher than approximately 80 percent or a pre-established value equal to or lower than approximately 60 percent, still more preferably, a pre-established value equal to or higher than approximately 85 percent, or yet more preferably, a pre-established value equal to or higher than approximately 90 percent, in order for the vibrating body 124, upon excited at a frequency equal to the resonant frequency of the torsional vibration, to generate only the torsional vibration, without generating any lateral vibration.

In the present embodiment, a setting of the length ratio "γ" to a value other than 50 percent would cause a location of an interconnection between each mirror-side leaf spring 142 and each frame-side leaf spring 144 (i.e., a location of the connection 146), to move away from the center of the lengthwise dimension of each integral spring 140.

Further, in the present embodiment, a setting of the length ratio "γ" to a value higher than 50 percent would cause each frame-side leaf spring 144 to be longer than each mirror-side leaf spring 142.

Yet further, in the present embodiment, a setting of the length ratio "γ" to a value higher than approximately 70 percent would cause the resonant frequency of the torsional vibration to be higher than that of the lateral vibration.

Figure 14:
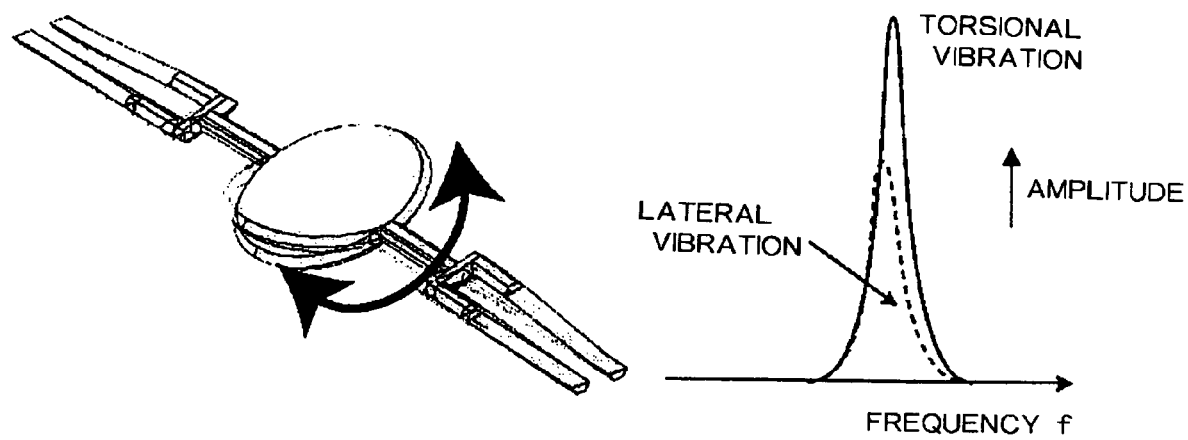
FIG. 14 is a perspective view and a graph for explaining the vibration of the vibrating body 124 in state B indicated in FIG. 8.

In contrast, in FIG. 14, there are illustrated in perspective view and graph the vibrations of the vibrating body 124 in state B indicated in FIG. 8. In state B, as graphed in FIG. 14, when the vibrating body 124 is excited at a frequency equal to the resonant frequency of the torsional vibration, the vibrating body 124 generates the torsional vibration at the vibrational frequency (resonant frequency) with a maximum intensity, concurrently with a slightly strong lateral vibration.

Accordingly, in state B, as illustrated in FIG. 14 in perspective view, when the vibrating body 124 is excited at a frequency equal to the resonant frequency of the torsional vibration, the vibrating body 124 is caused to produce a swing movement which is a compound movement of an angular oscillation about the oscillation axis 134 and a lateral movement. Therefore, in state B, not only the torsional vibration required for optical scan, but also the lateral vibration not required for optical scan are excited on the vibrating body 124.

In the present embodiment, an optimized value of the length ratio "γ" provides an optimized shape of each integral spring 140 extending lengthwise, to thereby allow only the torsional vibration to be excited on the vibrating body 124, resulting in a desired vibration of the vibrating body 124 for optical scan.

Figure 15:
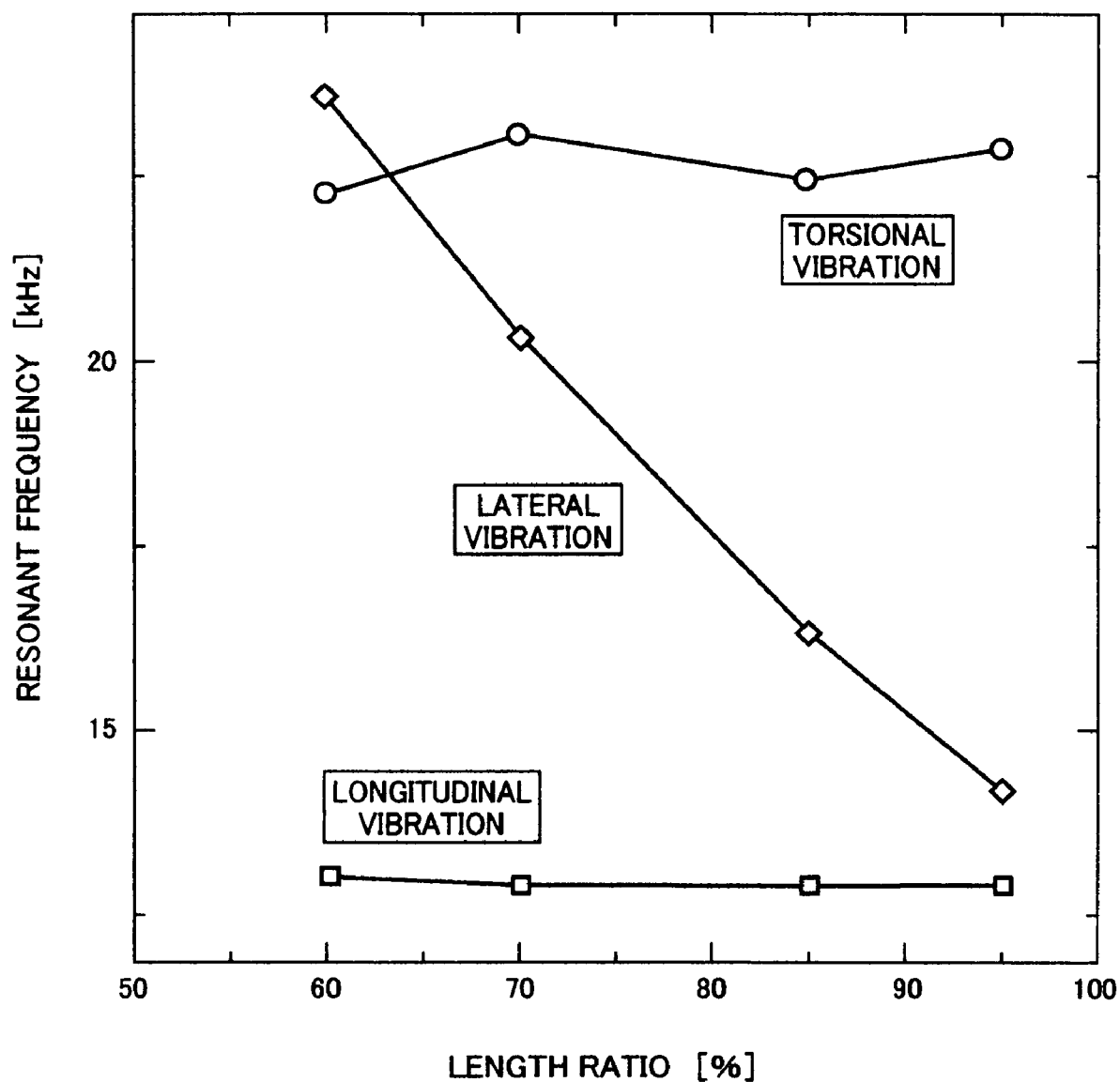
FIG. 15 is a graph indicating a relationship between resonant frequencies and length ratios of a comparative example of a vibrating body having a reflective mirror of rectangular thin-plate shape.

In the present embodiment, the reflective mirror 122 is in the shape of a circular-thin-plate. In contrast, FIG. 15 illustrates in graph resonant frequency characteristics of a comparative example in which a reflective mirror is in the shape of a rectangular-thin-plate. In the comparative example, a maximum width of the reflective mirror is set so as to be equal to that of the reflective mirror 122 in the present embodiment.

As is evident from the graph in FIG. 15, the resonant frequency of the torsional vibration is almost held approximately 22.5 kHz in the comparative example, whatever a value of the length ratio "γ" is. That value of the resonant frequency is lower than approximately 30 kHz which is the resonant frequency of the torsional vibration in the present embodiment. One of the reasons is that the moment of inertia of the reflective mirror in the comparative example is larger than that of the reflective mirror 122 in the present embodiment, resulting in reduction in the resonant frequency of the reflective mirror in the comparative example into below that in the present embodiment.

Therefore, the present embodiment, because of the reflective mirror 122 being shaped as a circular-thin-plate, would make it easier to increase a scanning frequency of the optical scanner 104 and eventually to enhance the resolution of an image to be displayed, than when the reflective mirror 122 is hypothetically in the shape of a rectangular-thin-plate.

As will be evident from the above description, the present embodiment would make it easier to allow the optical scanner 104 to perform optical scan, at a relatively high frequency, while avoiding the optical scan from being affected by vibrations other than the torsional vibration.

As will be clear from the above description, in the present embodiment, the length ratio "γ" constitutes an example of the "shape-defining parameter" set forth in the above mode (1), and the lateral vibration constitutes an example of the "disturbing vibration" set forth in the same mode.

Further, in the present embodiment, each mirror-side leaf spring 142 constitutes an example of the "first spring portion" set forth in the above mode (2), a pair of laterally-disposed frame-side leaf springs 144 and 144 constitute an example of the "plurality of the second spring portions" set forth in the same mode, on each side of the reflective mirror 122, and the stationary frame 116 constitutes an example of the "stationary member" set forth in the same mode.

Still further, in the present embodiment, each recess 158, when viewed by dividing each frame-side leaf spring 144 into a first division disposed close to the stationary frame 116, and a second division disposed close to each mirror-side leaf spring 142, is formed in each frame-side leaf spring 144 at its first division, to thereby the first division is reduced in thickness than the second division. That is to say, in the present embodiment, the formation of each recess 158 constitutes an example of reduction in thickness or thinning according to the above mode (3).

Next, there will be described a second embodiment of the present invention.

The present embodiment is in common in many elements to the first embodiment, while is different only in elements pertinent to the width of each segment of each integral spring 140. Therefore, only the different elements of the present embodiment will be described in greater detail below, while the common elements of the present embodiment will be omitted in detailed description by referring to the common elements using the identical reference numerals or names to those in the first embodiment.

In the first embodiment, as illustrated in FIG. 7, each mirror-side leaf spring 142 has an effective width of 75 μm, and each frame-side leaf spring 144 has an effective width of 55 μm.

In contrast, in the present embodiment, each mirror-side leaf spring 142 and each frame-side leaf spring 144 have respective pre-established effective widths larger than those in the first embodiment, respectively. More specifically, each mirror-side leaf spring 142 has a pre-established effective width of 100 μm, and each frame-side leaf spring 144 has a pre-established effective width of 80 μm.

That is to say, the widths of each mirror-side leaf spring 142 and each frame-side leaf spring 144 are larger than those in the first embodiment, respectively, providing greater torsional rigidity of each mirror-side leaf spring 142 and greater flexural rigidity of each frame-side leaf spring 144 than those in the first embodiment, respectively.

Figure 16:
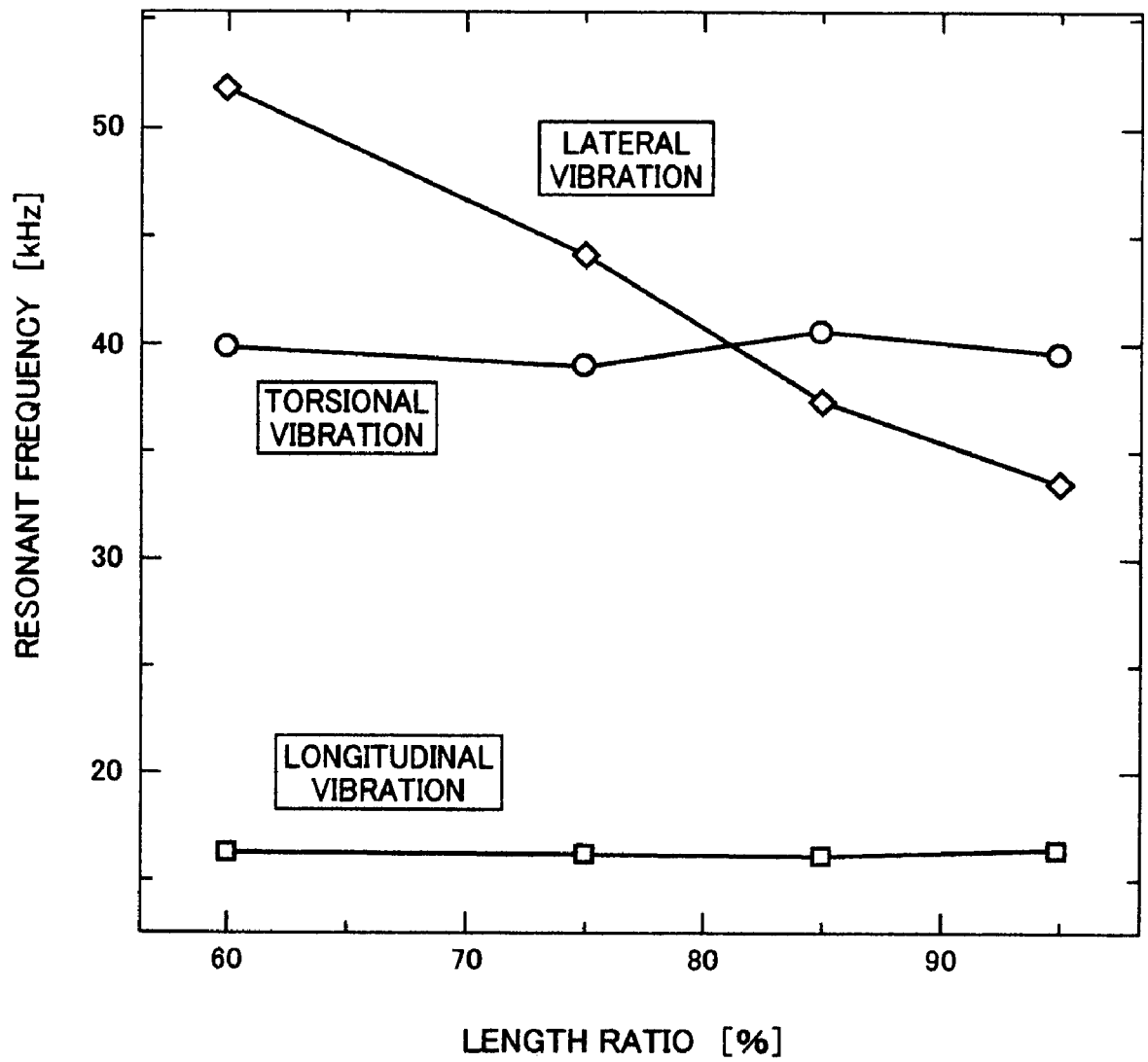
FIG. 16 is a graph indicating a relationship between resonant frequencies and length ratios of a vibrating body 124 in an optical scanning device 104 constructed according to a second embodiment of the present invention.

FIG. 16 illustrates in graph resonant frequency characteristics of a vibrating body 124 constructed according to the present embodiment. In the present embodiment, a resonant frequency of a torsional vibration is approximately 40 kHz which is higher than that in the first embodiment. A resonant frequency of a lateral vibration increases as the length ratio "γ" decreases, so as to become equal to the resonant frequency of the torsional vibration at a length ratio "γ" of approximately 82 percent. That is to say, in the present embodiment, the selection of a length ratio "γ" of approximately 82 percent allows the torsional vibration and the lateral vibration to coincide in resonant frequency with each other.

Additionally, as illustrated in FIG. 16, in the present embodiment, a resonant frequency difference between the torsional and lateral vibrations increases as the length ratio "γ" increases from approximately 82 percent, and similarly, the resonant frequency difference between the torsional and lateral vibrations increases as the length ratio "γ" decreases from approximately 82 percent.

In view of the above, in the present embodiment, the length ratio "γ" has, for example, a pre-established value equal to or lower than approximately 80 percent or a pre-established value equal to or higher than approximately 85 percent, more preferably, a pre-established value equal to or lower than approximately 75 percent or a pre-established value equal to or higher than approximately 90 percent, still more preferably, a pre-established value equal to or lower than approximately 70 percent or a pre-established value equal to or higher than approximately 95 percent.

As will be evident from the above description, the present embodiment would make it easier to allow the optical scanner 104 to perform optical scan, at a relatively high frequency, while avoiding the optical scan from being affected by vibrations other than the torsional vibration.

Next, there will be described a third embodiment of the present invention.

The present embodiment is in common in many elements to the first embodiment, while is different only in elements pertinent to the width of each segment of each integral spring 140. Therefore, only the different elements of the present embodiment will be described in greater detail below, while the common elements of the present embodiment will be omitted in detailed description by referring to the common elements using the identical reference numerals or names to those in the first embodiment.

In the first embodiment, as illustrated in FIG. 7, each mirror-side leaf spring 142 has an effective width of 75 μm, and each frame-side leaf spring 144 has an effective width of 55 μm.

In contrast, in the present embodiment, each mirror-side leaf spring 142 and each frame-side leaf spring 144 have respective pre-established effective widths smaller than those in the first embodiment, respectively. More specifically, each mirror-side leaf spring 142 has a pre-established effective width of 10 μm, and each frame-side leaf spring 144 has a pre-established effective width of 1 μm.

That is to say, the widths of each mirror-side leaf spring 142 and each frame-side leaf spring 144 are smaller than those in the first embodiment, respectively, providing smaller torsional rigidity of each mirror-side leaf spring 142 and smaller flexural rigidity of each frame-side leaf spring 144 than those in the first embodiment, respectively.

Figure 17:
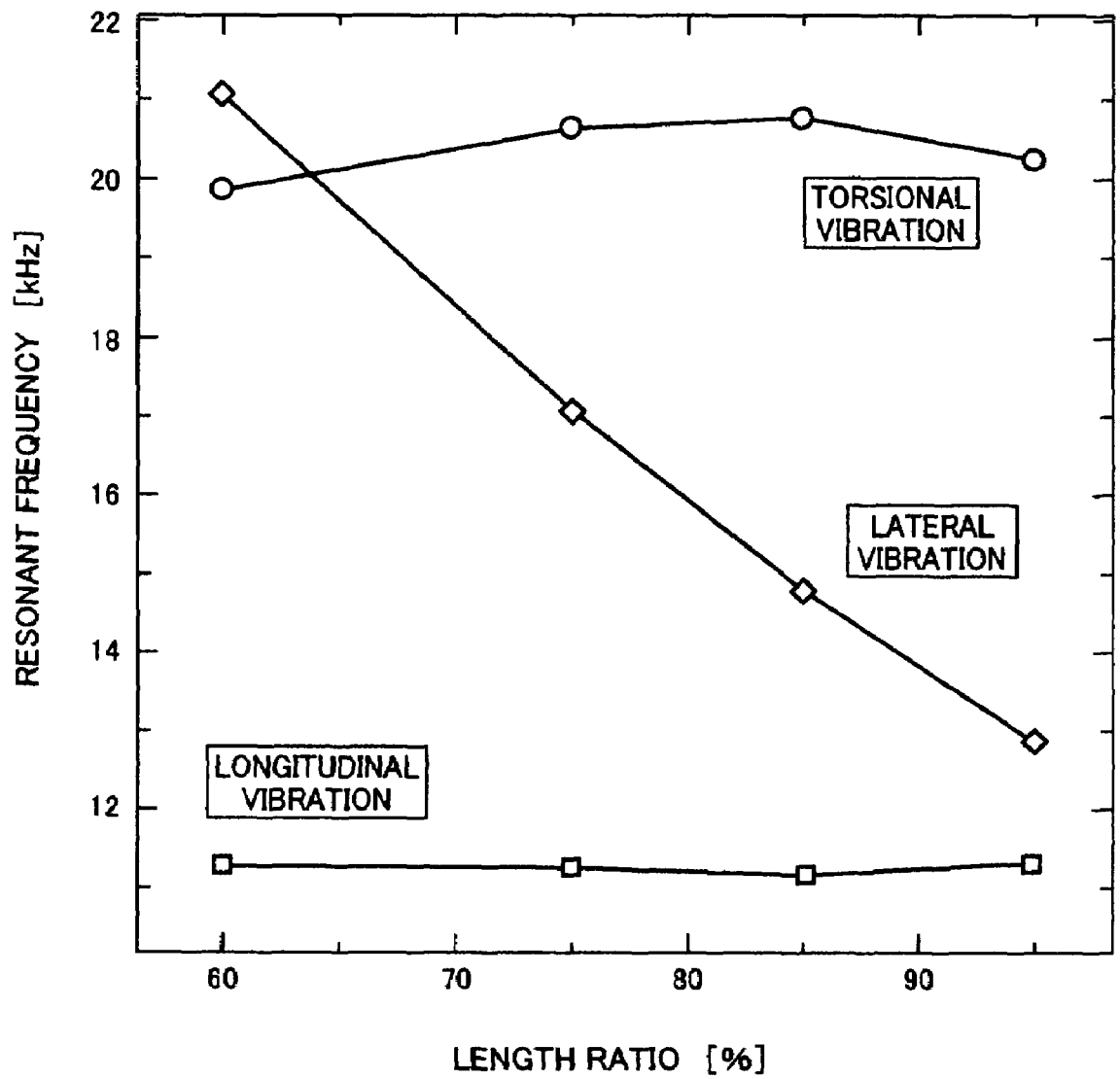
FIG. 17 is a graph indicating a relationship between resonant frequencies and length ratios of a vibrating body 124 in an optical scanning device 104 constructed according to a third embodiment of the present invention.

FIG. 17 illustrates in graph resonant frequency characteristics of a vibrating body 124 constructed according to the present embodiment. In the present embodiment, a resonant frequency of a torsional vibration is approximately 20 kHz which is lower than that in the first embodiment. A resonant frequency of a lateral vibration increases as the length ratio "γ" decreases, so as to become equal to the resonant frequency of the torsional vibration at a length ratio "γ" of approximately 65 percent. That is to say, in the present embodiment, the selection of a length ratio "γ" of approximately 65 percent allows the torsional vibration and the lateral vibration to coincide in resonant frequency with each other.

In addition, as illustrated in FIG. 17, in the present embodiment, a resonant frequency difference between the torsional and lateral vibrations increases as the length ratio "γ" increases from approximately 65 percent, and similarly, the resonant frequency difference between the torsional and lateral vibrations increases as the length ratio "γ" decreases from approximately 65 percent.

To this in mind, in the present embodiment, the length ratio "γ" has, for example a pre-established value equal to or lower than approximately 60 percent or a pre-established value equal to or higher than approximately 70 percent, more preferably, a pre-established value equal to or higher than approximately 75 percent, still more preferably, a pre-established value equal to or higher than approximately 80 percent.

Next, there will be described a fourth embodiment of the present invention.

The present embodiment is in common in many elements to the third embodiment, while is different only in elements pertinent to a thickness of each integral spring 140, and therefore, only the different elements of the present embodiment will be described in greater detail below, while the common elements of the present embodiment will be omitted in detailed description by referring to the common elements using the identical reference numerals or names to those in the third embodiment.

In the third embodiment, as illustrated in FIG. 7, each integral spring 140 (excluding a portion of its recess 158) has a thickness of 100 μm. In contrast, in the present embodiment, each integral spring 140 has a pre-established thickness smaller than that in the third embodiment. More specifically, each integral spring 140 has a pre-established thickness of 40 μm.

That is to say, each integral spring 140 is thinned so as to be smaller in thickness than that in the third embodiment, providing smaller torsional rigidity of each mirror-side leaf spring 142 and smaller flexural rigidity of each frame-side leaf spring 144 than those in the third embodiment, respectively.

Figure 18:
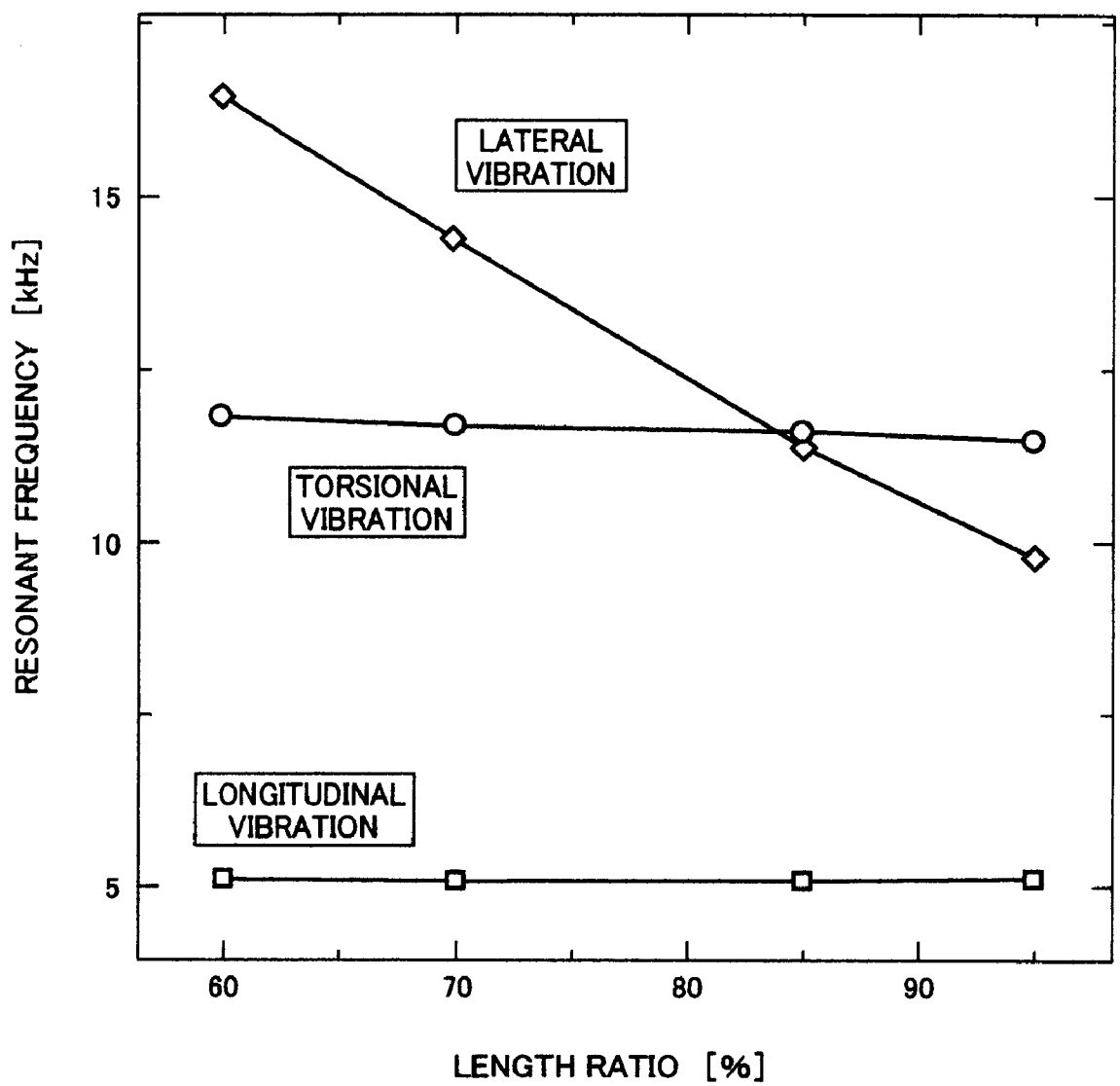
FIG. 18 is a graph indicating a relationship between resonant frequencies and length ratios of a vibrating body 124 in an optical scanning device 104 constructed according to a fourth embodiment of the present invention.

FIG. 18 illustrates in graph resonant frequency characteristics of a vibrating body 124 constructed according to the present embodiment. In the present embodiment, a resonant frequency of a torsional vibration is approximately 12 kHz which is lower than that in the third embodiment. A resonant frequency of a lateral vibration increases as the length ratio "γ" decreases, so as to become equal to the resonant frequency of the torsional vibration at a length ratio "γ" of approximately 85 percent.

That is to say, in the present embodiment, the selection of a length ratio "γ" of approximately 85 percent allows the torsional vibration and the lateral vibration to coincide in resonant frequency with each other.

Additionally, as illustrated in FIG. 18, in the present embodiment, a resonant frequency difference between the torsional and lateral vibrations increases as the length ratio "γ" increases from approximately 85 percent, and similarly, the resonant frequency difference between the torsional and lateral vibrations increases as the length ratio "γ" decreases from approximately 85 percent.

To this in mind, in the present embodiment, the length ratio "γ" has, for example, a pre-established value equal to or lower than approximately 80 percent or a pre-established value equal to or higher than approximately 90 percent, more preferably, a pre-established value equal to or lower than approximately 75 percent or a pre-established value equal to or higher than approximately 95 percent, still more preferably, a pre-established value equal to or lower than approximately 70 percent.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. An apparatus for use in optical scanning, which vibrates at least a part of a vibrating body having a light-reflective surface, to thereby allow light, upon entry, to be reflected from the light-reflective surface in varying directions, the vibrating body comprising:
(a) a reflective mirror having the light-reflective surface;
(b) an integral spring extending from the reflective mirror and being excited to generate at least a torsional vibration; and
(c) a stationary member cooperating with the reflective mirror to support the integral spring, the integral spring having both ends coupled to the stationary member, wherein the integral spring includes:
a first spring portion, coupled at its one end to the reflective mirror, and excited to generate a torsional vibration; and
a plurality of second spring portions coextending from a remaining end of the first spring portion in a bifurcation fashion, coupled to the stationary member, and excited to generate a bending vibration and a torsional vibration, and wherein:
the vibrating body has vibrational characteristics in which whether or not a resonant frequency of the torsional vibration and a resonant frequency of a disturbing vibration are equal to each other depends upon a shape-defining parameter for defining a shape of the integral spring extending lengthwise, the disturbing vibration being in the form of a vibration of the integral spring other than the torsional vibration thereof and being a lateral vibration in which the reflective mirror is vibrated in a direction parallel to the light-reflective surface;

the shape-defining parameter is defined as a percentage of lengthwise dimensions of the plurality of second spring portions with respect to a lengthwise dimension of the integral spring; and the shape-defining parameter is pre-set to fall within a range allowing the resonant frequency of the torsional vibration and the resonant frequency of the disturbing vibration to be different from each other.

2. The apparatus according to claim 1, wherein each of the second spring portions, when divided into a first division disposed close to the stationary member and a second division disposed close to the first spring portion, is smaller in thickness of a plate at the first division than at the second division.

3. The apparatus according to claim 1, wherein the shape-defining parameter is pre-set to allow a position at which the first spring portion and the plurality of second spring portions are coupled to each other, to be disposed apart from a center of the lengthwise dimension of the integral spring.

4. The apparatus according to claim 1, wherein the shape-defining parameter is pre-set to allow the lengthwise dimensions of the plurality of second spring portions to be greater than a lengthwise dimension of the first spring portion.

5. The apparatus according to claim 1, wherein the shape-defining parameter is pre-set to fall within a range in which the resonant frequency of the torsional vibration is higher than a resonant frequency of the lateral vibration.

6. The apparatus according to claim 1, wherein the shape-defining parameter is pre-set to fall within a range in which the resonant frequency of the torsional vibration is approximately 1 kHz or more apart from a resonant frequency of the lateral vibration.

7. The apparatus according to claim 1, wherein the resonant frequency of the torsional vibration is pre-set to fall within a range of approximately 12 kHz to approximately 40 kHz.

8. The apparatus according to claim 7,
wherein the shape-defining parameter is pre-set to fall within a range of approximately 65 percent to approximately 85 percent, excluding a resonant frequency at which the torsional vibration and the disturbing vibration coincide with each other.

9. The apparatus according to claim 1, wherein the reflective mirror and the integral spring are each generally in the form of a plate and in coplanar alignment with each other.

10. The apparatus according to claim 1, wherein the reflective mirror is generally in the form of a disc having opposite faces, at least one of which is the light-reflective surface.

11. The apparatus according to claim 1, wherein the reflective mirror is angularly oscillated about an oscillation axis by the torsional vibration,
wherein the integral spring includes a first integral spring member extending from the reflective mirror and being excited to generate at least a torsional vibration; and a second integral spring member extending from the reflective mirror and being excited to generate at least a torsional vibration, and
wherein the first and second integral spring members are disposed in the vibrating body at two opposite positions to each other in a direction of the oscillation axis, respectively, with the reflective mirror being interposed between the two opposite positions.

12. The apparatus according to claim 11, wherein the first and second integral spring members disposed at the respective two opposite positions are disposed symmetrically to each other with respect to a position of the reflective mirror.

13. An apparatus for forming an image by scanning a light beam, comprising:
a light source emitting the light beam; and
an optical scanning device having an optical scanner, scanning the light beam emitted from the light source, using the optical scanner, wherein the optical scanner, for use in optical scanning, vibrates at least a part of a vibrating body having a light-reflective surface, to thereby allow the light beam, upon entry, to be reflected from the light-reflective surface in varying directions, the vibrating body comprising:

(a) a reflective mirror having the light-reflective surface;

(b) an integral spring extending from the reflective mirror and being excited to generate at least a torsional vibration; and (c) a stationary member cooperating with the reflective mirror to support the integral spring, the integral spring having both ends coupled to the stationary member, wherein the integral spring includes:

a first spring portion, coupled at its one end to the reflective mirror, and excited to generate a torsional vibration; and a plurality of second spring portions coextending from a remaining end of the first spring portion in a bifurcation fashion, coupled to the stationary member, and excited to generate a bending vibration and a torsional vibration, and wherein:

the vibrating body has vibrational characteristics in which whether or not a resonant frequency of the torsional vibration and a resonant frequency of a disturbing vibration are equal to each other depends upon a shape-defining parameter for defining a shape of the integral spring extending lengthwise, the disturbing vibration being in the form of a vibration of the integral spring other than the torsional vibration thereof and being a lateral vibration in which the reflective mirror is vibrated in a direction parallel to the light-reflective surface;

the shape-defining parameter is defined as a percentage of lengthwise dimensions of the plurality of second spring portions with respect to a lengthwise dimension of the integral spring; and the shape-defining parameter is pre-set to fall within a range allowing the resonant frequency of the torsional vibration and the resonant frequency of the disturbing vibration to be different from each other.

14. The apparatus according to claim 13, wherein the optical scanning device scans the light beam on a retina of a viewer two-dimensionally, to thereby project the image onto the retina.

15. An apparatus for use in optical scanning, which vibrates at least a part of a vibrating body having a light-reflective surface, to thereby allow light, upon entry, to be reflected from the light-reflective surface in varying directions, the vibrating body comprising:

(a) a reflective mirror having the light-reflective surface;

(b) an integral spring extending from the reflective mirror and being excited to generate at least a torsional vibration; and (c) a stationary member cooperating with the reflective mirror to support the integral spring, the integral spring having both ends coupled to the stationary member, wherein the integral spring includes:

a first spring portion, coupled at its one end to the reflective mirror, and excited to generate a torsional vibration; and a plurality of second spring portions coextending from a remaining end of the first spring portion in a bifurcation fashion, coupled to the stationary member, and excited to generate a bending vibration and a torsional vibration, and wherein each of the second spring portions, when divided into a first division disposed close to the stationary member and a second division disposed close to the first spring portion, is smaller in thickness of a plate at the first division than at the second division.

16. The apparatus according to claim 15, wherein the vibrating body has vibrational characteristics in which whether or not a resonant frequency of the torsional vibration and a resonant frequency of a disturbing vibration are equal to each other depends upon a shape-defining parameter for defining a shape of the integral spring extending lengthwise, the disturbing vibration being in the form of a vibration of the integral spring other than the torsional vibration thereof.

* * * * *